(12) United States Patent
Teng et al.

(10) Patent No.: US 12,043,538 B2
(45) Date of Patent: *Jul. 23, 2024

(54) SEMICONDUCTOR DEVICE STRUCTURE WITH MOVABLE MEMBRANE

(71) Applicant: Taiwan Semiconductor Manufacturing Company, Ltd., Hsinchu (TW)

(72) Inventors: Yi-Chuan Teng, Zhubei (TW); Chun-Yin Tsai, Hsinchu (TW); Chia-Hua Chu, Zhubei (TW); Chun-Wen Cheng, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 112 days.

This patent is subject to a terminal disclaimer.

(21) Appl. No.: 17/711,204

(22) Filed: Apr. 1, 2022

(65) Prior Publication Data
US 2022/0227618 A1    Jul. 21, 2022

Related U.S. Application Data

(60) Continuation of application No. 16/731,183, filed on Dec. 31, 2019, now Pat. No. 11,292,712, which is a
(Continued)

(51) Int. Cl.
*H01L 41/113* (2006.01)
*B81B 3/00* (2006.01)
(Continued)

(52) U.S. Cl.
CPC .............. *B81B 3/001* (2013.01); *B81B 3/007* (2013.01); *B81C 1/00158* (2013.01);
(Continued)

(58) Field of Classification Search
CPC ............. H01L 25/0657; H01L 21/8221; H01L 27/0688; H01L 27/14636; H01L 27/14634;
(Continued)

(56) References Cited

U.S. PATENT DOCUMENTS 6,248,249 B1    6/2001   Silverbrook
7,502,482 B2    3/2009   Dehe et al.
(Continued)

*Primary Examiner* — Jarrett J Stark
(74) *Attorney, Agent, or Firm* — McClure, Qualey & Rodack, LLP

(57) ABSTRACT

Structures and formation methods of a semiconductor device structure are provided. The semiconductor device structure includes a substrate and a first dielectric layer formed over the substrate. The semiconductor device structure also includes a first movable membrane formed over the first dielectric layer. In addition, the first movable membrane has a first corrugated portion and a first edge portion connecting to the first corrugated portion. The semiconductor device structure further includes a second dielectric layer formed over the first movable membrane. In addition, the first edge portion is sandwiched between the first dielectric layer and the second dielectric layer, the first corrugated portion is partially sandwiched between the first dielectric layer and
(Continued)

the second dielectric layer and is partially exposed by a cavity, and a bottom surface of the first corrugated portion is lower than a bottom surface of the first edge portion.

20 Claims, 23 Drawing Sheets

Related U.S. Application Data division of application No. 15/873,937, filed on Jan. 18, 2018, now Pat. No. 10,526,196.

(60) Provisional application No. 62/583,064, filed on Nov. 8, 2017.

(51) Int. Cl.
  *B81C 1/00* (2006.01)
  *H04R 19/00* (2006.01)
  *H10N 30/30* (2023.01)

(52) U.S. Cl.
  CPC .......... *H04R 19/005* (2013.01); *H10N 30/308* (2023.02); *B81B 2201/0257* (2013.01); *B81B 2203/0127* (2013.01); *B81B 2203/0315* (2013.01); *B81B 2207/07* (2013.01)

(58) Field of Classification Search
  CPC . H01L 2224/08121; H01L 2224/08147; H01L 2225/06548; H01L 23/522
  See application file for complete search history.

(56) References Cited

U.S. PATENT DOCUMENTS

| | | | |
|---|---|---|---|
| 9,403,670 B2 | 8/2016 | Schelling et al. | |
| 9,815,685 B2* | 11/2017 | Chang | H04R 19/005 |
| 2010/0330722 A1* | 12/2010 | Hsieh | G01P 15/125 |
| | | | 257/E21.211 |
| 2012/0161257 A1* | 6/2012 | Friza | H04R 23/00 |
| | | | 257/416 |
| 2013/0221453 A1* | 8/2013 | Dehe | H04R 19/005 |
| | | | 257/E29.324 |
| 2014/0010374 A1* | 1/2014 | Kasai | H04R 3/00 |
| | | | 381/26 |
| 2014/0270271 A1* | 9/2014 | Dehe | H04R 23/00 |
| | | | 381/174 |
| 2017/0142525 A1* | 5/2017 | Glacer | H04R 31/00 |
| 2017/0238107 A1* | 8/2017 | Walther | G01K 7/028 |
| | | | 438/53 |
| 2017/0247244 A1* | 8/2017 | Dehe | B81B 3/0021 |
| 2017/0355591 A1* | 12/2017 | Hedenig | H04R 19/005 |
| 2018/0115836 A1* | 4/2018 | Hsieh | H04R 31/003 |
| 2018/0317021 A1* | 11/2018 | Dehe | H04R 19/04 |
| 2019/0052976 A1* | 2/2019 | Sun | H04R 7/04 |
| 2019/0135610 A1* | 5/2019 | Teng | B81B 3/007 |
| 2020/0336842 A1* | 10/2020 | Kwon | H04R 19/04 |
| 2020/0339411 A1* | 10/2020 | Chen | H04R 7/18 |
| 2021/0047176 A1* | 2/2021 | Cheng | B81C 1/00825 |
| 2021/0168497 A1* | 6/2021 | Wen | H04R 31/00 |

* cited by examiner

SEMICONDUCTOR DEVICE STRUCTURE WITH MOVABLE MEMBRANE

CROSS REFERENCE TO RELATED APPLICATIONS

This application is a Continuation application of U.S. patent application Ser. No. 16/731,183, filed on Dec. 31, 2019 (now U.S. Pat. No. 11,292,712, issued on Apr. 5, 2022), which is a Divisional application of U.S. patent application Ser. No. 15/873,937, filed on Jan. 18, 2018 (now U.S. Pat. No. 10,526,196, issued on Jan. 7, 2020), which claims the benefit of U.S. Provisional Application No. 62/583,064 filed on Nov. 8, 2017, the entirety of which are incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Micro-electro mechanical system (MEMS) devices have recently been developed. MEMS devices include devices fabricated using semiconductor technology to form mechanical and electrical features. The MEMS devices may include a number of elements (e.g., movable elements) for achieving mechanical functionality.

MEMS applications include microphone, motion sensors, pressure sensors, printer nozzles, or the like. Other MEMS applications include inertial sensors, such as accelerometers for measuring linear acceleration and gyroscopes for measuring angular velocity. Moreover, MEMS applications may extend to optical applications, such as movable mirrors, and radio frequency (RF) applications, such as RF switches and the like.

Although existing devices and methods for forming MEMS devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
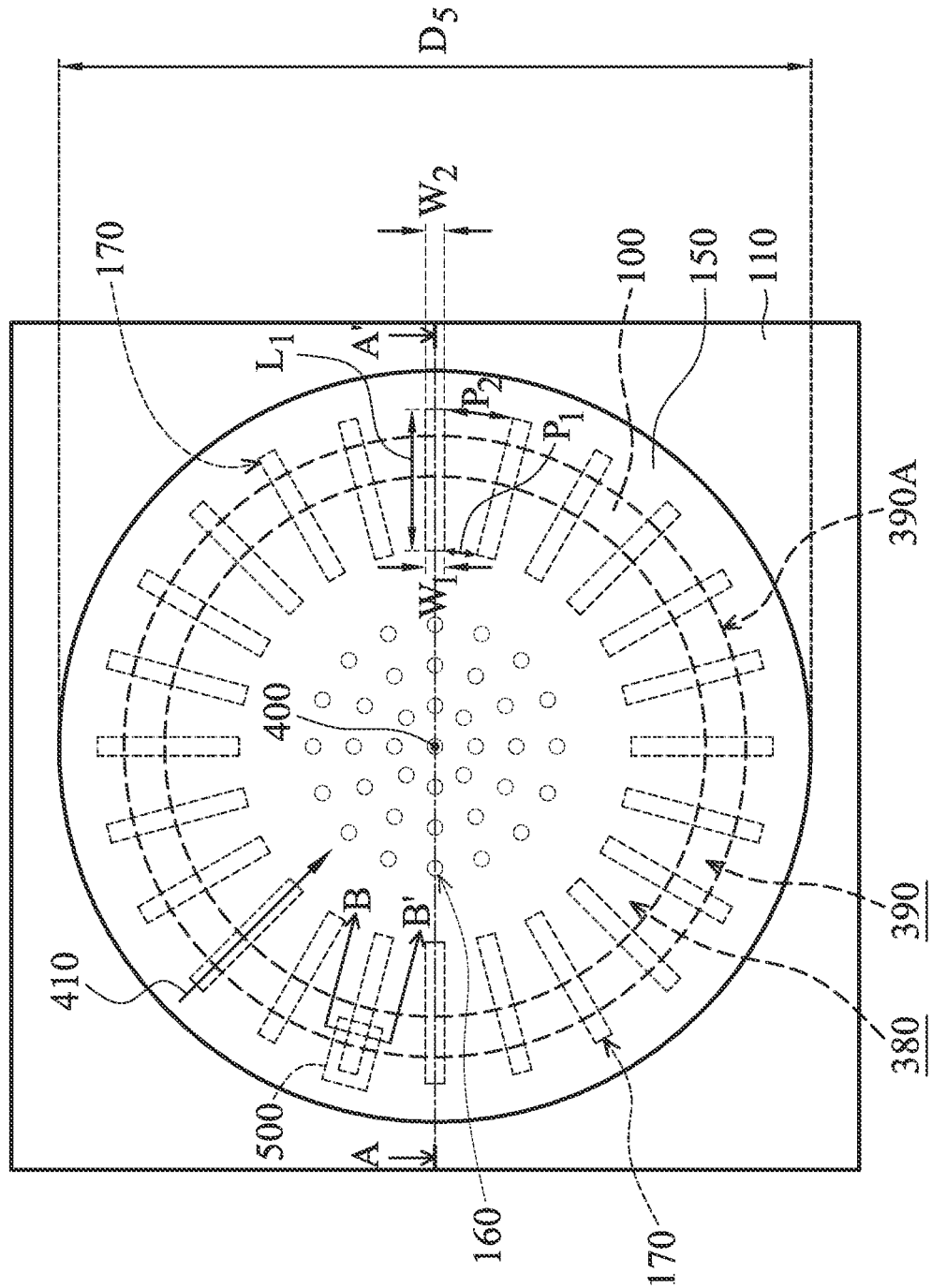
FIG. 1 show a top view of a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

FIG. 1 show a top view of a semiconductor device structure, in accordance with some embodiments. FIGS. 2A-2J are cross-sectional views along the line A-A' of FIG. 1, showing various stages of a process for forming the semiconductor device structure shown in FIG. 1, in accordance with some embodiments. Some features of the semiconductor device structure, for example, a semiconductor substrate 100, a dielectric layer 110 and a membrane 150 are shown in FIG. 1. In addition, other features of the semiconductor device structure are not shown in FIG. 1 for a better understanding of the structure.

Figure 2A:
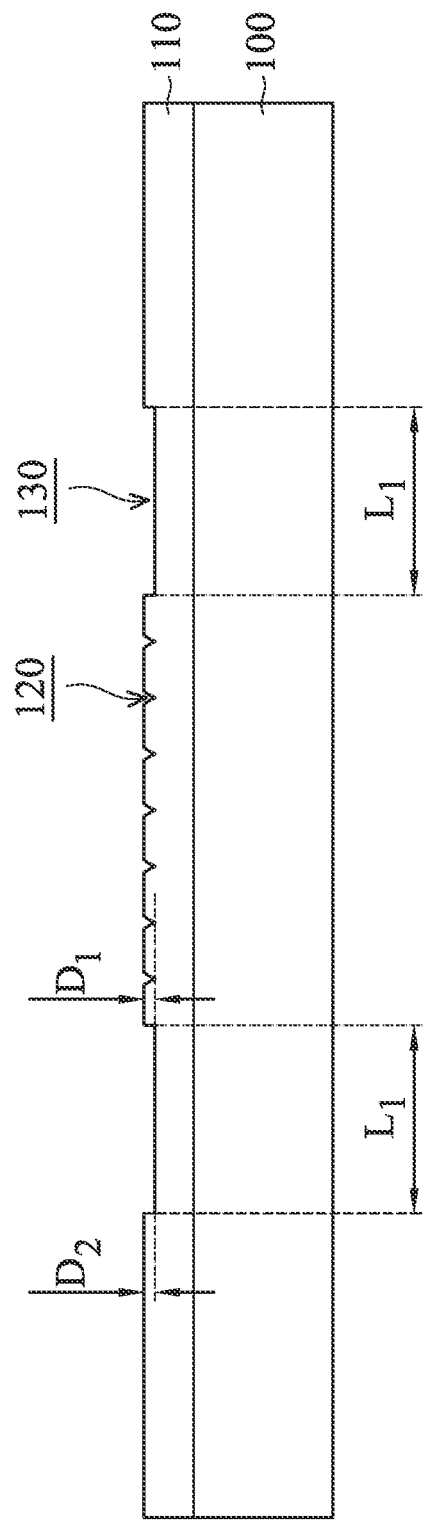
FIGS. 2A-2J are cross-sectional views along the line A-A' of FIG. 1, showing various stages of a process for forming a semiconductor device structure, in accordance with some embodiments.

As shown in FIG. 2A, a semiconductor substrate 100 is provided. In some embodiments, the semiconductor substrate 100 is a bulk semiconductor substrate, such as a semiconductor wafer. In some embodiments, the semiconductor substrate 100 includes silicon or another elementary semiconductor material such as germanium. The semiconductor substrate 100 may be made of low resistive silicon. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

As shown in FIG. 2A, a dielectric layer 110 is deposited over the semiconductor substrate 100, in accordance with some embodiments. In some embodiments, the dielectric layer 110 includes or is made of silicon oxide, another suitable oxide or dielectric material, or a combination thereof. In some embodiments, the dielectric layer 110 is deposited using a chemical vapor deposition (CVD) process, a spin-on process, a spray coating process, an atomic layer deposition (ALD) process, a physical vapor deposition (PVD) process, another applicable process, or a combination thereof.

As shown in FIG. 2A, the dielectric layer 110 is partially removed, in accordance with some embodiments. As a result, multiple openings 120 and recesses 130 are formed in the dielectric layer 110. In some embodiments, the depth $D_1$ of the openings 120 is in a range from about 0.1 μm to about 5 μm. In some embodiments, the depth $D_2$ of the recesses 130 is in a range from about 0.1 μm to about 5 μm. As shown in FIG. 2A, the depth $D_2$ is substantially equal to the depth $D_1$. However, embodiments of the disclosure are not limited thereto. The depth $D_2$ may be greater than the depth $D_1$.

As shown in FIG. 2A, the recesses 130 are longer than the openings 120. In some embodiments, the length $L_1$ of the recesses 130 is in a range from about 5 μm to about 100 μm. The recesses 130 are wider than the openings 120, so the recesses 130 have larger dimensions than the openings 120. It should be noted that these described ranges are only examples and are not a limitation to the disclosure.

In some embodiments, one or more photolithography and etching processes are performed to form the openings 120 and recesses 130. In some embodiments, the openings 120 and the recesses 130 are formed using the same process at the same stage. For example, the recesses 130 are formed during the formation of the openings 120. Therefore, the formation of the recesses 130 does not increase the cost or the number of steps in the fabrication process.

However, embodiments of the disclosure are not limited thereto. In some other embodiments, the recesses 130 are formed before or after the formation of the openings 120. The depth $D_2$ may be different from the depth $D_1$ according to requirements. In addition, there may be loading effect during etching processes for forming the openings 120 and recesses 130. As a result, the depth $D_2$ may be different from the depth $D_1$.

Figure 2B:
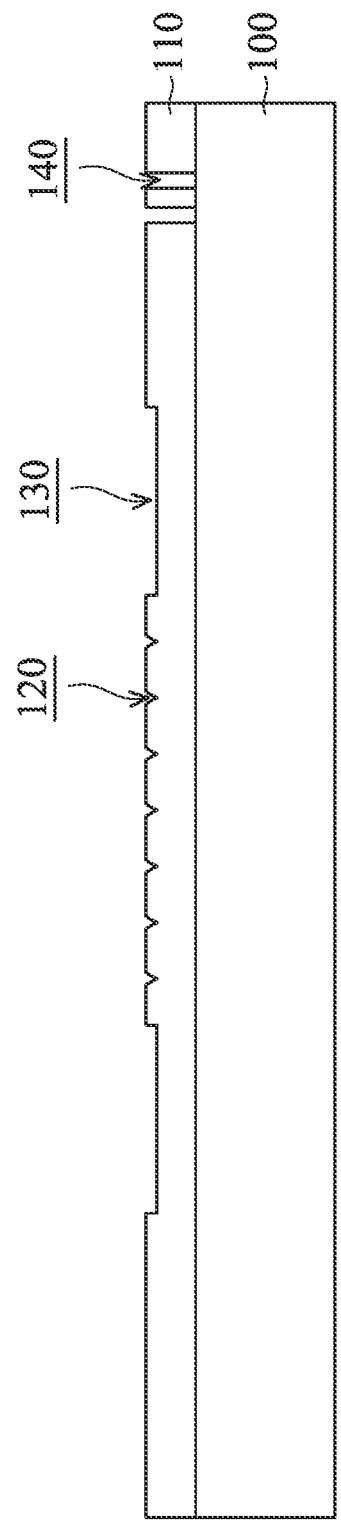

As shown in FIG. 2B, the dielectric layer 110 is partially removed or etched to form multiple via holes 140 in the dielectric layer 110, in accordance with some embodiments. The via holes 140 penetrate through the dielectric layer 110 so that the semiconductor substrate 100 is partially exposed from the via holes 140. In some embodiments, the recesses 130 are arranged between the via holes 140 and the openings 120. In some embodiments, the openings 120 are nearer the recesses 130 than the via holes 140.

Figure 2C:
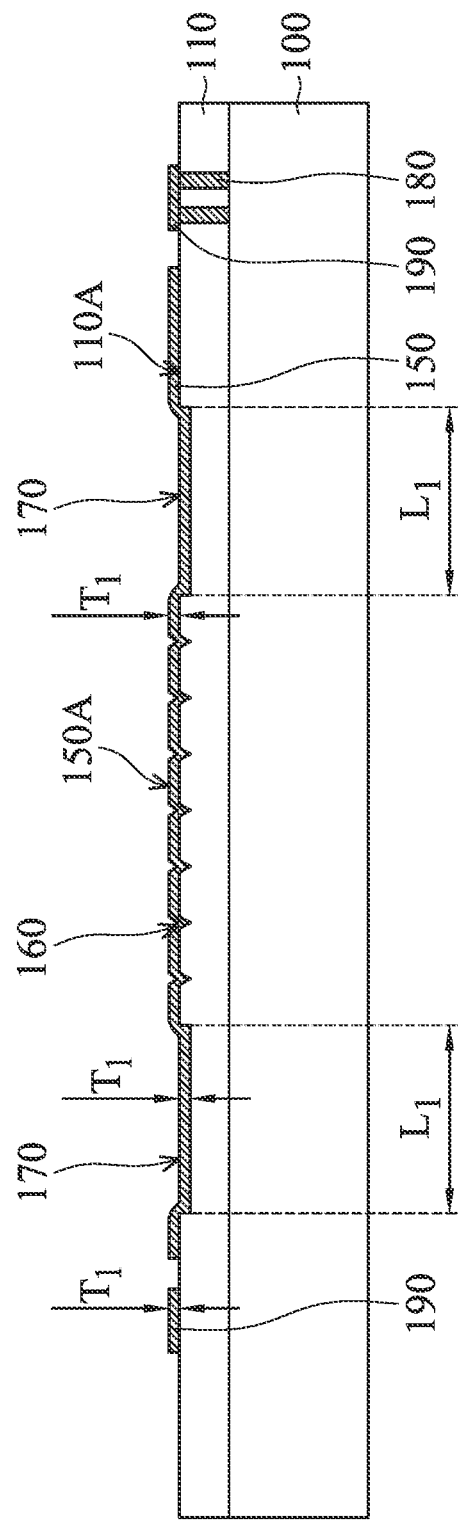

Afterwards, a membrane material (or conductive material) is conformally deposited over the dielectric layer 110. The membrane material is then patterned or etched. As a result, a membrane 150 is formed, as shown in FIG. 2C in accordance with some embodiments. The dielectric layer 110 will be partially removed (or released) in subsequent processes. It allows the membrane 150 to have free movement in at least one axis to achieve mechanical functionality. The membrane 150 may be referred to as a diaphragm.

In some embodiments, the membrane material includes or is made of a semiconductor material (such as polysilicon or another suitable semiconductor), a metal material, another suitable conductive material, or a combination thereof. In some embodiments, the membrane material is deposited using a CVD process, an ALD process, a sputtering process, an electroplating process, an electroless plating process, another applicable process, or a combination thereof.

The membrane material fills the openings 120 and the recesses 130, in accordance with some embodiments. As shown in FIG. 2C, some portions of the membrane material filling the openings 120 and the recesses 130 form multiple recessed portions 160 and 170 of the membrane 150, respectively. The recessed portions 160 and 170 downwardly protrude from the top surface 110A of the dielectric layer 110 and extend in the dielectric layer 110 towards the semiconductor substrate 100. The recessed portions 160 and 170 are integrated with the membrane 150.

Due to the recessed portions 160, the top surface 150A of the membrane 150 has dimples. As a result, the contact area between the membrane 150 and a subsequently formed membrane, which will be described in more detail later, is reduced. The membrane 150 is prevented from being adhered to another membrane. The recessed portions 160 may be V-shaped or another suitable shape.

Due to the recessed portions 170, the top surface 150A of the membrane 150 has depressions which are much larger than dimples, as shown in FIG. 2C. The depressions, which correspond to the recessed portions 170, form a sunken corrugation on the top surface 150A of the membrane 150. The recessed portions 170 may also be referred to as corrugated portions. The depressions on the top surface 150A have similar or substantially the same topography as the recessed portions 170. The profile and arrangement of the recessed portions 170 will be described in more detail later.

In some embodiments, the thickness $T_1$ of the membrane 150 (or the recessed portions 170) is in a range from about 0.3 μm to about 5 μm. In some embodiments, the length $L_1$ of the recessed portions 170 is in a range from about 5 μm to about 100 μm.

In some embodiments, the membrane material further fills the via holes 140. Some portions of the membrane material filling the via holes 140 form multiple conductive vias 180, as shown in FIG. 2C. Some portions of the membrane material left over the top surface 110A of the dielectric layer 110 form multiple conductive features 190. The conductive features 190 are electrically connected to the semiconductor substrate 100 through the conductive vias 180.

Figure 2D:
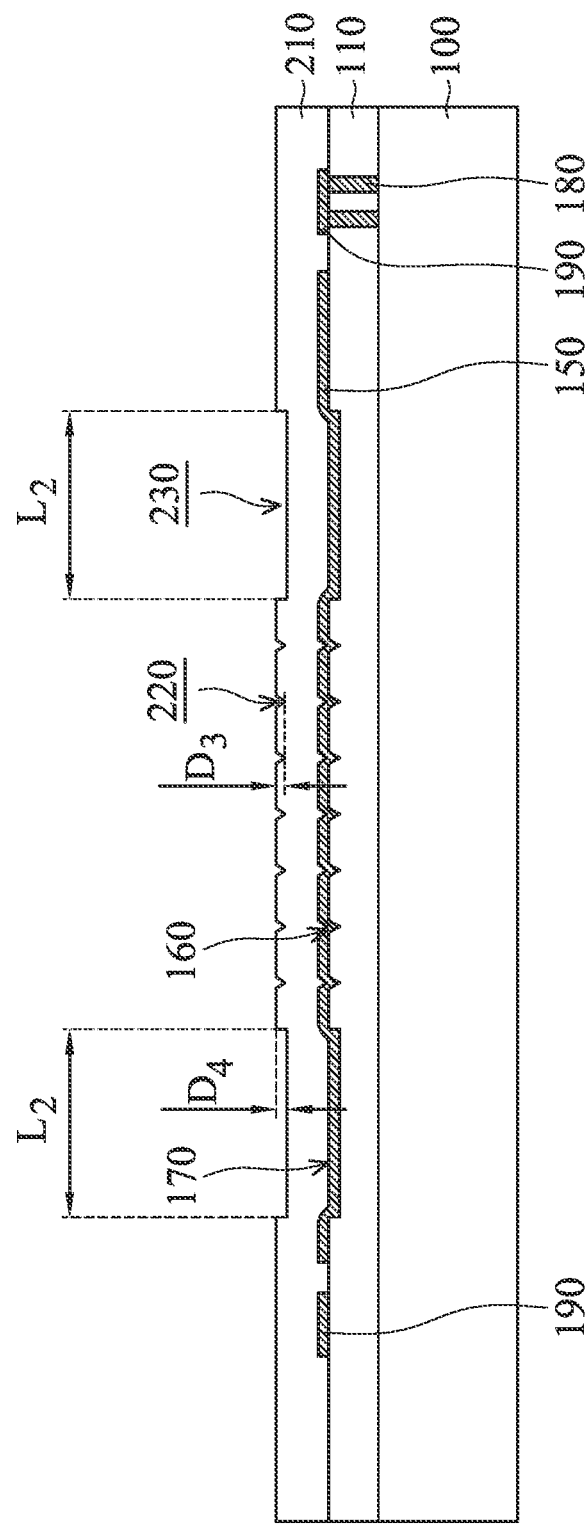

As shown in FIG. 2D, a dielectric layer 210 is deposited over the dielectric layer 110 and covers the membrane 150, in accordance with some embodiments. The dielectric layer 210 and the dielectric layer 110 may sandwich the membrane 150.

In some embodiments, the dielectric layer 210 includes or is made of silicon oxide, another suitable oxide or dielectric material, or a combination thereof. The dielectric layer 210 may include the same material as the dielectric layer 110, but embodiments of the disclosure are not limited thereto. In some embodiments, the dielectric layer 210 is deposited using a CVD process, a spin-on process, a spray coating process, an ALD process, a PVD process, another applicable process, or a combination thereof.

As shown in FIG. 2D, the dielectric layer 210 is partially removed, in accordance with some embodiments. As a result, multiple openings 220 and recesses 230 are formed in the dielectric layer 210. In some embodiments, the depth $D_3$ of the openings 220 is in a range from about 0.1 µm to about 5 µm. In some embodiments, the depth $D_4$ of the recesses 230 is in a range from about 0.1 µm to about 5 µm.

As shown in FIG. 2D, the depth $D_4$ is substantially equal to the depth $D_3$. However, embodiments of the disclosure are not limited thereto. The depth $D_4$ may be greater than the depth $D_3$. In some embodiments, the depth $D_3$ is substantially equal to the depth $D_1$ shown in FIG. 2A, but embodiments of the disclosure are not limited thereto. In some embodiments, the depth $D_4$ is substantially equal to the depth $D_2$ shown in FIG. 2A, but embodiments of the disclosure are not limited thereto. The depth $D_4$ may be greater or less than the depth $D_2$. The recesses 230 are longer and wider than the openings 220. In some embodiments, the length $L_2$ of the recesses 230 is in a range from about 5 µm to about 100 µm.

In some embodiments, one or more photolithography and etching processes are performed to form the openings 220 and the recesses 230. The recesses 230 are formed during, before or after the formation of the openings 220. The configuration and/or formation method of the openings 220 and the recesses 230 may be substantially the same as the openings 120 and recesses 130, respectively.

Figure 2E:
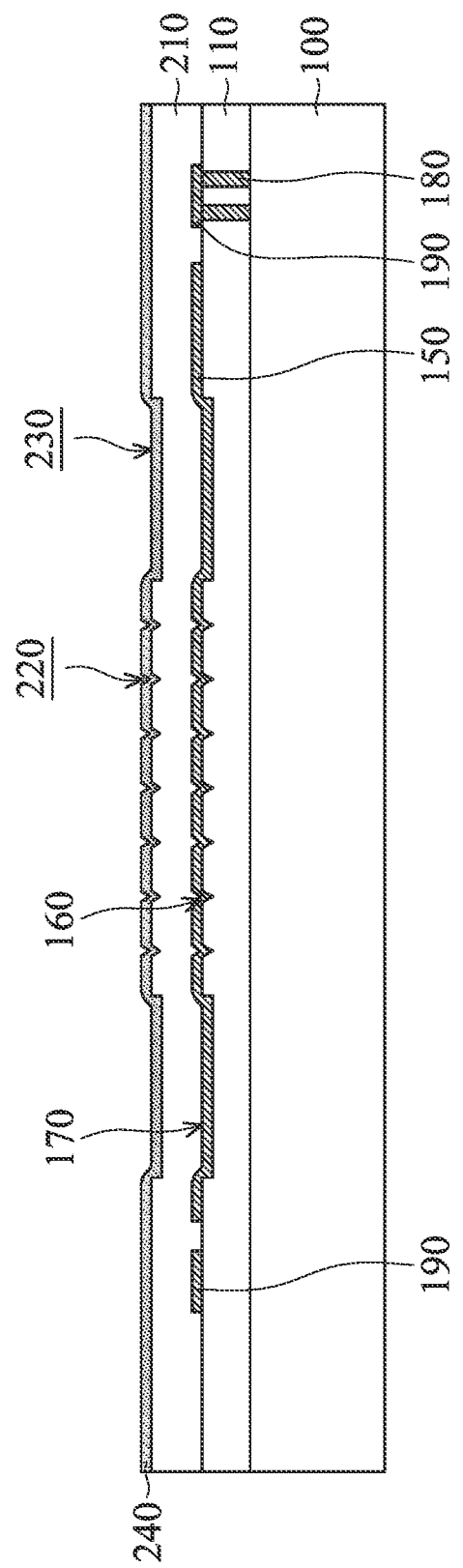

As shown in FIG. 2E, an isolation layer 240 is conformally deposited over the dielectric layer 210, in accordance with some embodiments. The isolation layer 240 fills the openings 220 and the recesses 230. Due to the openings 220 and the recesses 230, the top surface of the isolation layer 240 has dimples and depressions.

In some embodiments, the isolation layer 240 includes or is made of silicon nitride, another suitable isolation material, or a combination thereof. The material of the isolation layer 240 is different from the material of the dielectric layer 210 and the dielectric layer 110. In some embodiments, the isolation layer 240 is deposited using an ALD process, another applicable process, or a combination thereof.

Figure 2F:
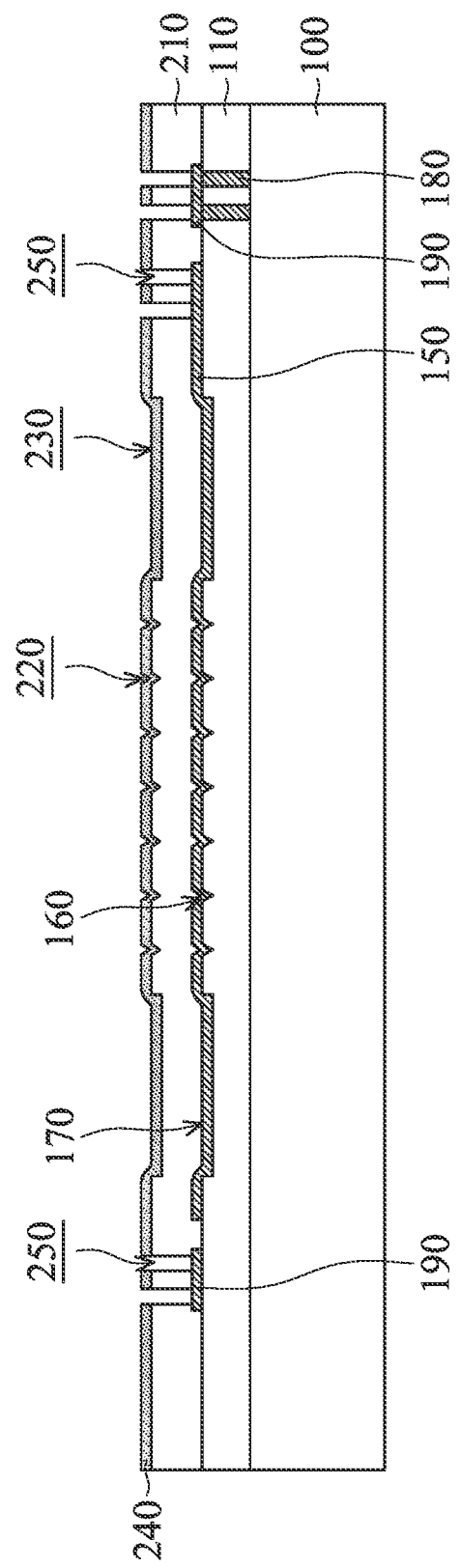

Afterwards, the isolation layer 240 and the dielectric layer 210 are partially removed. As a result, multiple via holes 250 are formed in the isolation layer 240 and the dielectric layer 210, as shown in FIG. 2F in accordance with some embodiments. The via holes 250 penetrate through the isolation layer 240 and the dielectric layer 210 so that the conductive features 190 and the membrane 150 are partially exposed from the via holes 250. In some embodiments, the recesses 230 are arranged between the via holes 250 and the openings 220.

Figure 2G:
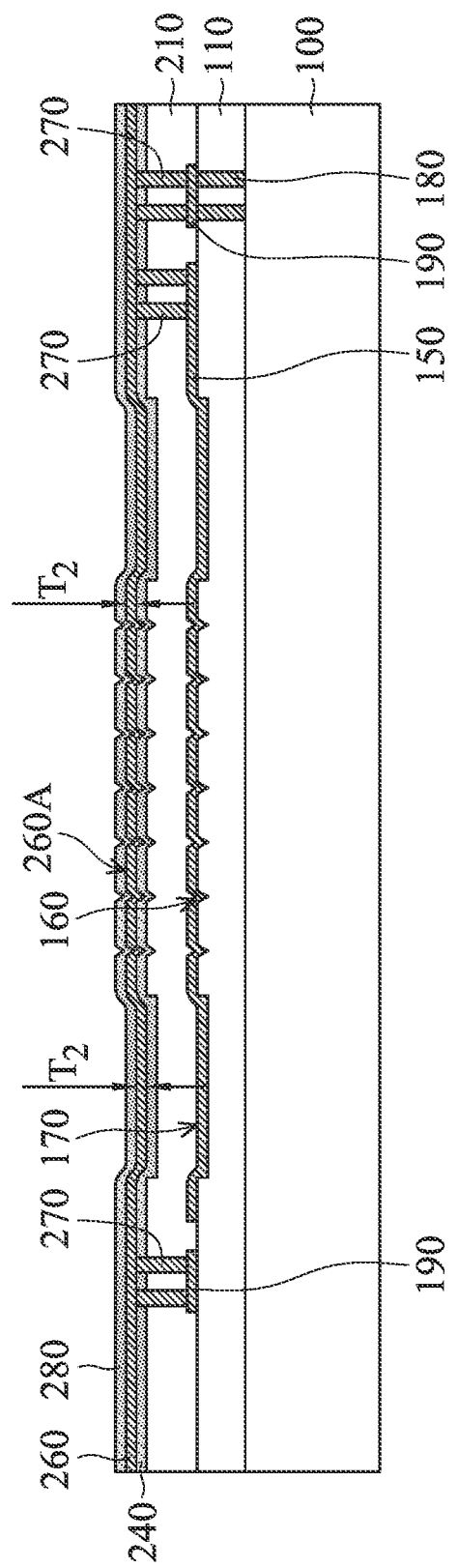

As shown in FIG. 2G, a membrane material 260 is conformally deposited over the isolation layer 240, in accordance with some embodiments. The membrane material 260 fills the dimples and the depressions on the top surface of the isolation layer 240. As a result, the top surface 260A of the membrane material 260 also includes dimples and depressions, which correspond to the openings 220 and the recesses 230 in the dielectric layer 210.

In some embodiments, the membrane material 260 further fills the via holes 250. As a result, some portions of the membrane material 260 form multiple conductive vias 270, as shown in FIG. 2G. The conductive vias 270 are electrically connected to the conductive features 190.

In some embodiments, the thickness $T_2$ of the membrane material 260 is in a range from about 0.3 µm to about 5 µm. In some embodiments, the membrane material 260 includes or is made of a semiconductor material (such as polysilicon or another suitable semiconductor), a metal material, another suitable conductive material, or a combination thereof. The membrane material 260 is the same as the material of the membrane 150, but embodiments of the disclosure are not limited. In some embodiments, the membrane material 260 is deposited using a CVD process, an ALD process, a sputtering process, an electroplating process, an electroless plating process, another applicable process, or a combination thereof.

As shown in FIG. 2G, an isolation layer 280 is conformally deposited over the membrane material 260, in accordance with some embodiments. The isolation layer 280 fills the dimples and the depressions on the top surface 260A of the membrane material 260. As a result, the top surface of the isolation layer 280 also includes dimples and depressions.

In some embodiments, the isolation layer 280 includes or is made of silicon nitride, another suitable isolation material, or a combination thereof. The isolation layer 280 and the isolation layer 240 include or are made of the same material, but embodiments of the disclosure are not limited. In some embodiments, the isolation layer 280 is deposited using an ALD process, another applicable process, or a combination thereof.

Figure 2H:
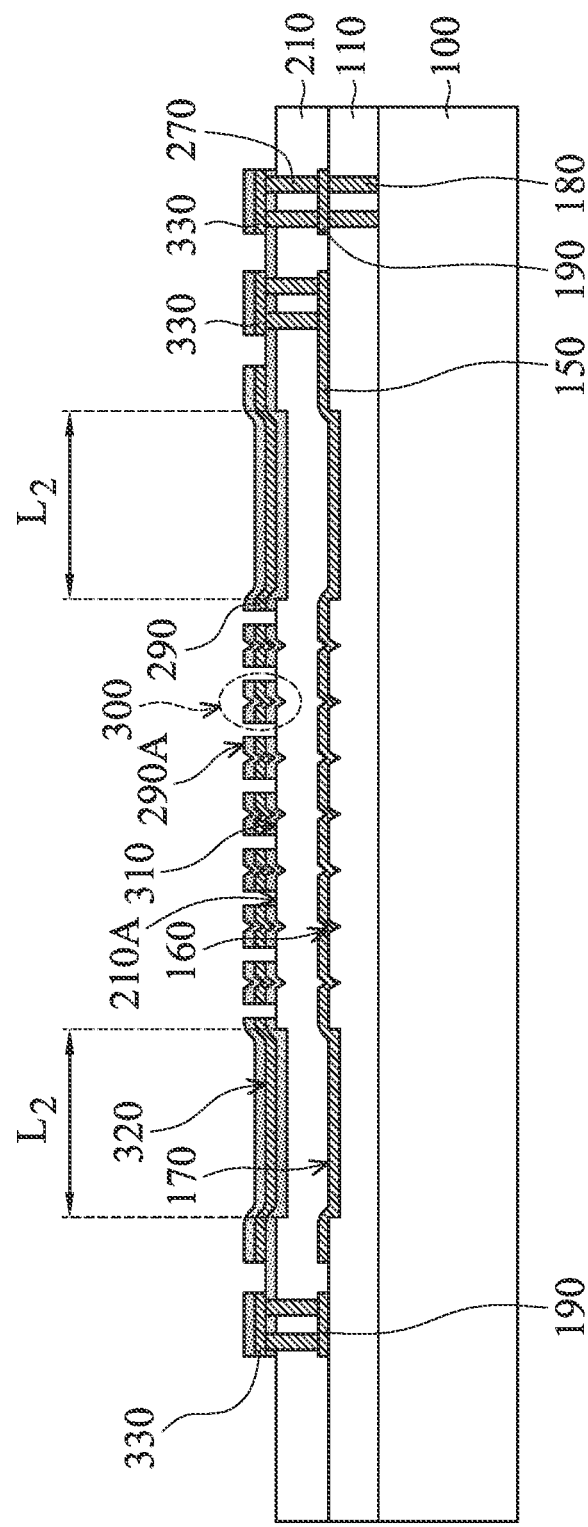

Afterwards, the isolation layer 240, the membrane material 260 and the isolation layer 280 are patterned or etched, in accordance with some embodiments. As a result, a membrane 290 is formed, as shown in FIG. 2H in accordance with some embodiments. The membrane 290 is a multi-layer structure, which includes the isolation layer 240, the membrane material 260 and the isolation layer 280. The membrane 290 may also be referred to as a diaphragm or a back plate.

Many variations and/or modifications can be made to embodiments of the disclosure. In some other embodiments, the isolation layer 240 and/or the isolation layer 280 are not formed. The membrane 290 may be a single layer, which is similar to or the same as the membrane 150. In addition, although figures show that the membrane 150 is a single layer, embodiments of the disclosure are not limited thereto. In some other embodiments, the membrane 150 is a composite or multi-layer structure, which is similar to or the same as the membrane 290.

As shown in FIG. 2H, the membrane 290 includes multiple movable (flexible) features 300, in accordance with some embodiments. The dielectric layer 210 will be partially removed (or released) in subsequent processes so that the movable features 300 are suspended. It allows the membrane 290 and the movable features 300 to have free movement in at least one axis to achieve mechanical functionality. For example, the movable features 300 are capable of bending, vibrating, and/or deforming.

Many variations and/or modifications can be made to embodiments of the disclosure. In some other embodiments, the membrane 290 does not include the movable features 300. The configuration of the membrane 290 may be similar to or the same as the configuration of the membrane 150. In addition, although figures show that the membrane 150 does not include multiple movable features, embodiments of the disclosure are not limited thereto. In some other embodiments, the membrane 150 includes multiple movable features, which is similar to or the same as the movable features 300.

As shown in FIG. 2H, the membrane 290 further includes multiple recessed portions 310 and 320, in accordance with some embodiments. The recessed portions 310 and 320 downwardly protrude from the top surface 210A of the dielectric layer 210 and extend in the dielectric layer 210 towards the membrane 150. The recessed portions 310 and 320 correspond to the openings 220 and the recesses 230 in the dielectric layer 210, respectively. The recessed portions 310 and 320 are integrated with each other.

Due to the recessed portions 310, the top surface 290A of the membrane 290 has dimples. The recessed portions 310 may be V-shaped or another shape. Due to the recessed portions 320, the top surface 290A of the membrane 290 has depressions which are much larger than dimples, as shown in FIG. 2H. The depressions, which correspond to the recessed portions 320, form a concave corrugation on the top surface 290A of the membrane 290, which will be described in more detail later. The depressions on the top surface 290A have similar or substantially the same topography as the recessed portions 230.

In some embodiments, the length $L_2$ of the recessed portions 320 is in a range from about 5 μm to about 100 μm. The length $L_2$ of the recessed portions 320 may be substantially equal to the length $L_1$ of the recessed portions 170. However, embodiments of the disclosure are not limited. The length $L_2$ may be greater or less than the length $L_1$.

In some embodiments, some portions of the membrane material 260 are left over the top surface of the isolation layer 240 and form multiple conductive features 330. The conductive features 330 are electrically connected to the conductive features 190 and/or the membrane 150 through the conductive vias 270.

Figure 2I:
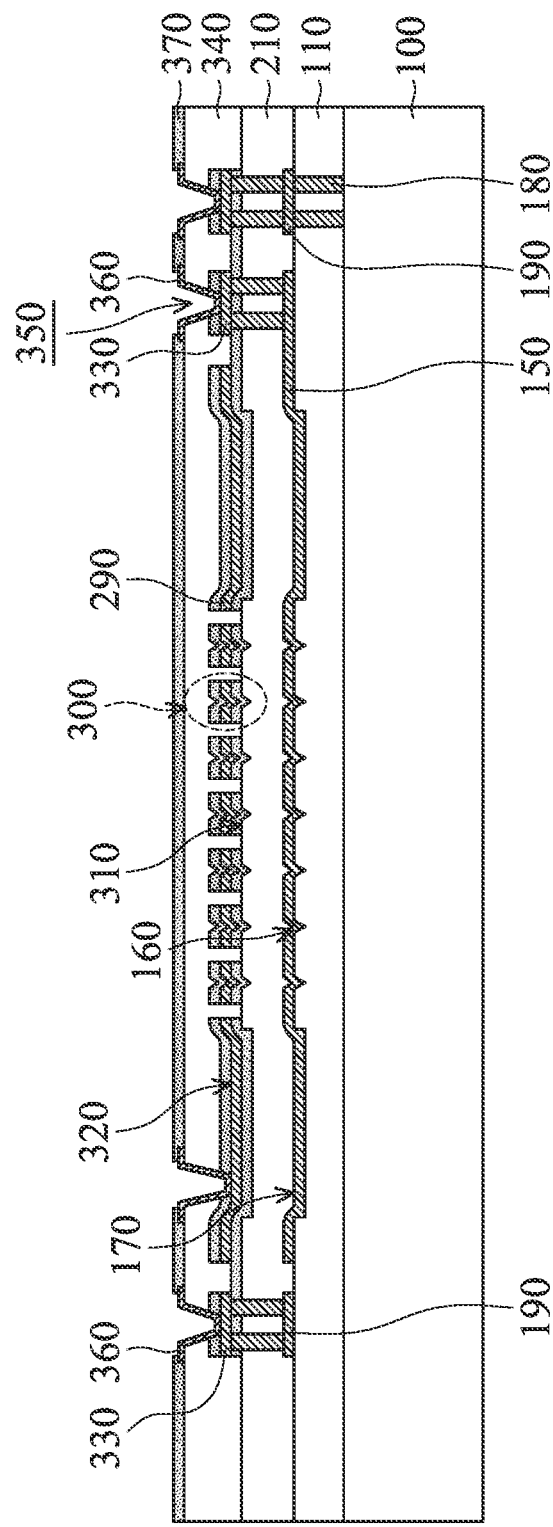

As shown in FIG. 2I, a dielectric layer 340 is deposited over the dielectric layer 210 and covers the membrane 290 and the conductive features 330, in accordance with some embodiments. Afterwards, the dielectric layer 340 is partially removed to form multiple openings 350, as shown in FIG. 2I. The openings 350 penetrate through the dielectric layer 340 and extend in the membrane 290. As a result, the membrane 290 and the conductive features 330 are partially exposed through the openings 350.

In some embodiments, the dielectric layer 340 includes or is made of silicon oxide, another suitable oxide or dielectric material, or a combination thereof. The dielectric layer 340 may include the same material as the dielectric layer 110, but embodiments of the disclosure are not limited thereto.

A patterned conductive layer 360 is formed over the dielectric layer 340 and extends in the openings 350 to electrically connect to the membrane 290 and the conductive features 330. In some embodiments, one of the openings 350 extends to the recessed portions 320 of the membrane 290. The conductive layer 360 may be in direct contact with the recessed portions 320. Subsequently, a protection layer 370 is deposited over the dielectric layer 340 to cover the conductive layer 360. The protection layer 370 includes a suitable dielectric material.

Figure 2J:
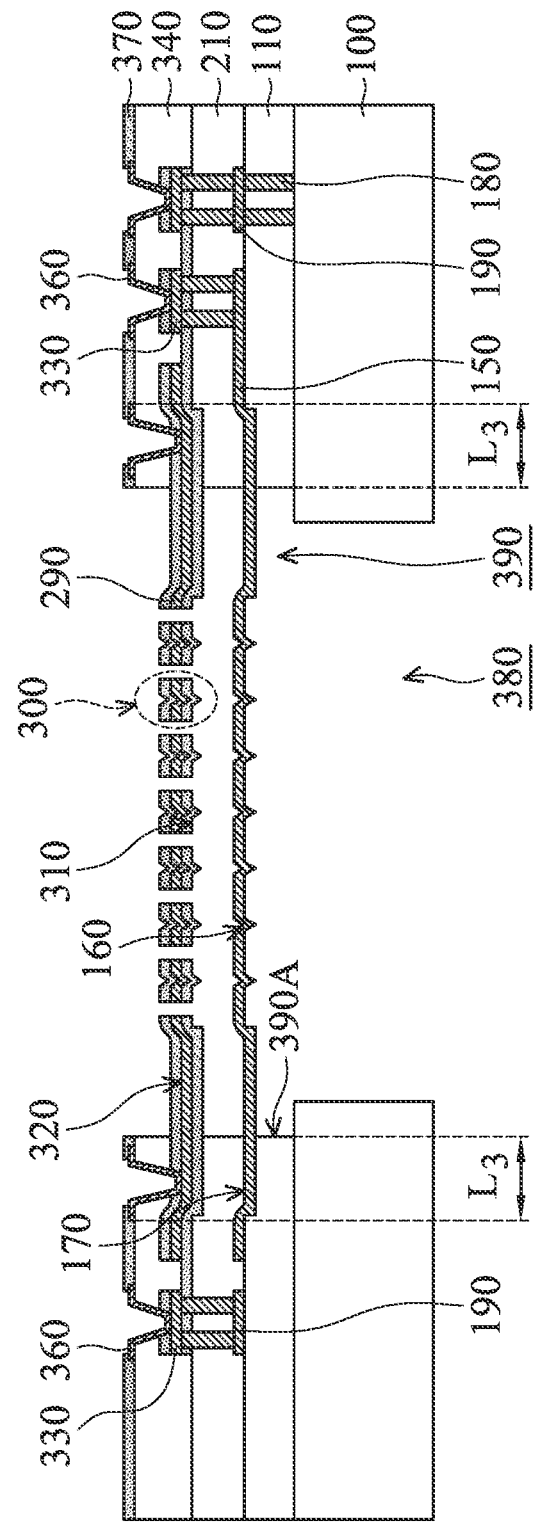

As shown in FIG. 2J, the semiconductor substrate 100 is partially removed, in accordance with some embodiments. As a result, a cavity 380 is formed in the semiconductor substrate 100. The semiconductor substrate 100 is partially removed using a dry etching process or a wet etching process.

Afterwards, the dielectric layer 110, the dielectric layer 210 and the dielectric layer 340 are partially removed (or released), as mentioned above. As a result, the membrane 150 and the membrane 290 are partially exposed through a cavity 390 and suspended in the cavity 390. The cavity 390 penetrates through the dielectric layer 110, the dielectric layer 210 and the dielectric layer 340. The dielectric layer 110, the dielectric layer 210 and/or the dielectric layer 340 are partially removed using a dry etching process or a wet etching process. In addition, the protection layer 370 is partially removed to partially expose the membrane 150 and the membrane 290 in the cavity 390 and the conductive layer 360.

In accordance with some embodiments, the cavity 390 is created for the membrane 150 and the membrane 290 to have free movement. Accordingly, a semiconductor device structure including MEMS elements is formed, as shown in FIGS. 1 and 2J.

More specifically, the recessed portions 160 of the membrane 150 and the recessed portions 310 of the membrane 290 are exposed through the cavity 390, as shown in FIG. 2J in accordance with some embodiments. The recessed portions 170 of the membrane 150 are partially exposed through the cavity 390 and partially embedded between the dielectric layer 110 and the dielectric layer 210. The recessed portions 320 of the membrane 290 are partially exposed through the cavity 390 and partially embedded between the dielectric layer 210 and the dielectric layer 340. The membrane 150 and the membrane 290 are firmly anchored into the dielectric layers 110, 210 and 340 through the recessed portions 170 and the recessed portions 320.

The recessed portions 170 and the recessed portions 320 have a length $L_3$ in the dielectric layer 110, as shown in FIG. 2J. In some embodiments, the length $L_3$ is in a range from about 0.1 μm to about 3 μm.

Many variations and/or modifications can be made to embodiments of the disclosure. In some other embodiments, the recessed portions 170 are exposed through the cavity 390 without being partially embedded between the dielectric layer 110 and the dielectric layer 210. In some other embodiments, the recessed portions 320 are exposed through the cavity 390 without being partially embedded between the dielectric layer 210 and the dielectric layer 340.

As shown in FIGS. 1 and 2J, the dielectric layer 110 overlaps the semiconductor substrate 100. The cavity 390 in the dielectric layer 110 is larger than the cavity 380 of the semiconductor substrate 100 so the semiconductor substrate 100 is partially exposed from the cavity 390.

The membrane 150 overlaps the cavity 380 and the cavity 390. Since the membrane 150 is larger than the cavity 380 and the cavity 390 so the membrane 150 further partially overlaps the dielectric layer 110 and the semiconductor substrate 100. In some embodiments, the cavity 380 and the cavity 390 are circular or circle-like. In some embodiments, the membrane 150 is circular or circle-like. However, embodiments of the disclosure are not limited thereto. In some embodiments, the diameter $D_5$ of the membrane 150 is in a range from about 100 μm to about 10 mm.

As shown in FIG. 1, the recessed portions 160 and 170 of the membrane 150 are illustrated as dashed lines for a better understanding of the structure. In some embodiments, the recessed portions 160 are positioned at the center region of the membrane 150, as shown in FIG. 1. The recessed portions 160 are within the cavity 390 without overlapping the semiconductor substrate 100. The recessed portions 160 are distributed around the center 400 of the membrane 150. The recessed portions 160 may be arranged in circles, which are spaced apart from the center 400 with different distances. However, embodiments of the disclosure are not limited. The recessed portions 160 may have another suitable arrangement.

In some embodiments, the recessed portions 170 are positioned at the peripheral region of the membrane 150, as shown in FIG. 1. The recessed portions 160 are surrounded by the recessed portions 170. The recessed portions 170 extend in the cavity 390 and partially overlap the semiconductor substrate 100. In some embodiments, the recessed portions 170 further stretch outside of the cavity 390. Accordingly, the recessed portions 170 further partially overlap the dielectric layer 110. The recessed portions 170 extend along a direction intersecting the edge 390A of the cavity 390.

However, embodiments of the disclosure are not limited. In some other embodiments, the recessed portions 170 are within the cavity 390 without overlapping the dielectric layer 110. In some embodiments, the recessed portions 170 do not reach the edge of the membrane 150, as shown in FIG. 1.

In some embodiments, the length $L_1$ of the recessed portions 170 is in a range from about 5 μm to about 100 μm. These recessed portions 170 may have substantially the same length $L_1$. The length $L_1$ may be varied according to the diameter $D_5$ of the membrane 150.

The recessed portions 170 include an inner width $W_1$ and an outer width $W_2$. In some embodiments, the inner width $W_1$ is in a range from about 0.3 μm to about 10 μm. In some embodiments, the outer width $W_2$ is in a range from about 0.3 μm to about 10 μm. In some embodiments, the inner width $W_1$ is substantially equal to the outer width $W_2$, as shown in FIG. 1. Accordingly, the recessed portions 170 are rectangular. These recessed portions 170 may have substantially the same inner width $W_1$. These recessed portions 170 may have substantially the same outer width $W_2$.

The recessed portions 170 include an inner interval (or pitch) $P_1$ and an outer interval $P_2$. In some embodiments, the inner interval $P_1$ is in a range from about 3 μm to about 100 μm. In some embodiments, the outer interval $P_2$ is in a range from about 3 μm to about 100 μm. In some embodiments, the inner interval $P_1$ is less than the outer interval $P_2$, as shown in FIG. 1.

Figure 4:
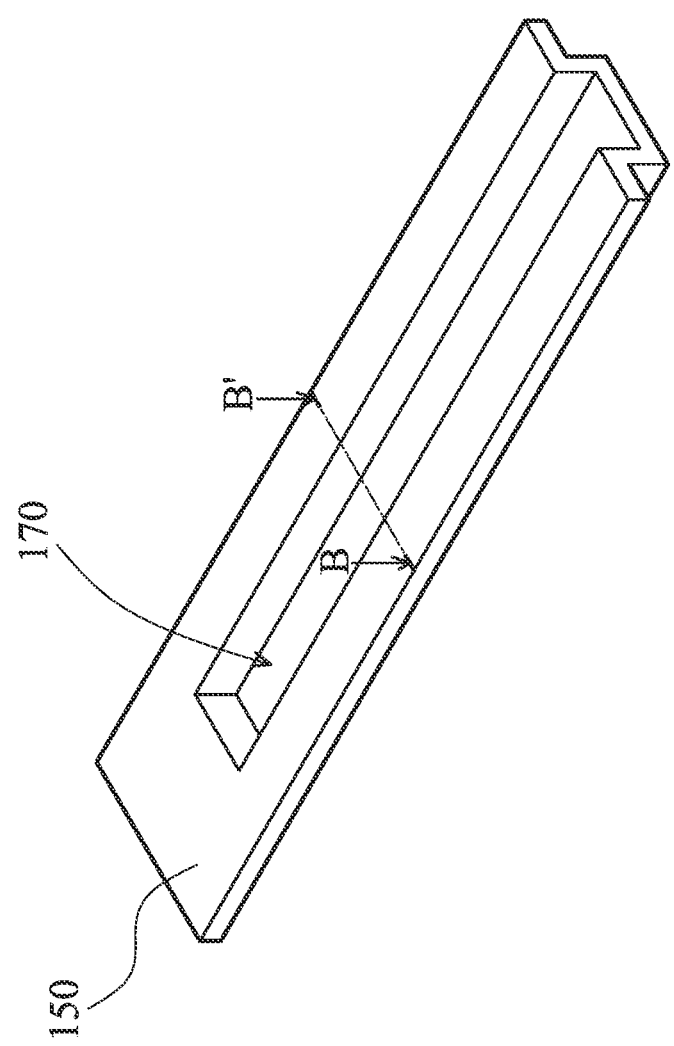
FIG. 4 is an enlarged and perspective view of FIG. 1, showing the recessed portion of the membrane, in accordance with some embodiments.
Figure 5A:
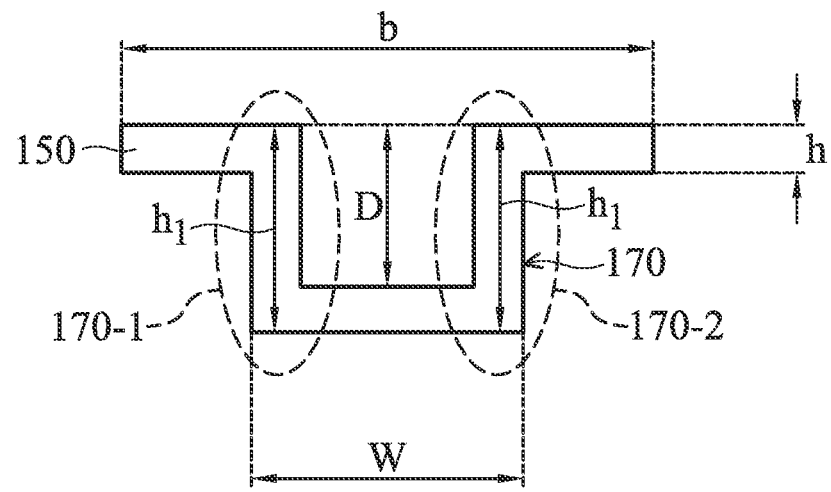
FIG. 5A is a cross-sectional view along the line B-B' of FIG. 4 to show the recessed portion of the membrane, in accordance with some embodiments.
Figure 5B:
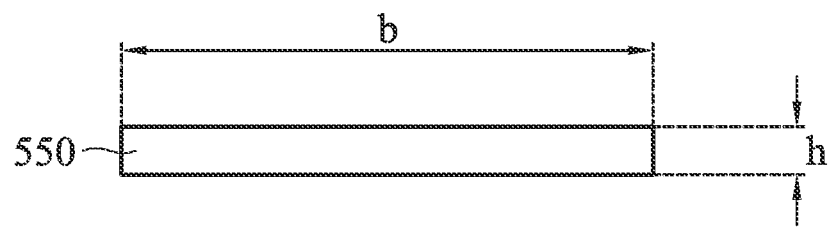
FIG. 5B is a cross-sectional view of the membrane without the recessed portion, in accordance with a comparative embodiment.

FIG. 4 is an enlarged and perspective view of a portion 500 of FIG. 1, showing the recessed portion 170 of the membrane 150, in accordance with some embodiments. FIG. 5A is a cross-sectional view along the line B-B' of FIG. 4 to show the recessed portion 170 of the membrane 150, in accordance with some embodiments. FIG. 5B is a cross-sectional view of a membrane 550 without a recessed portion, in accordance with a comparative embodiment. Advantages of the semiconductor device structure including MEMS elements may be described using FIGS. 1, 2J, 4, 5A and 5B.

As shown in FIG. 1, the recessed portions 170 are separated from each other and arranged in an array, in accordance with some embodiments. The array is a circle extending along the edge 390A of the cavity 390. The array may intersect the edge 390A of the cavity 390. Accordingly, the array of the recessed portions 170 forms a ring-shaped corrugation. The membrane 150 with the recessed portions 170 may be similar to a wave-board shown in FIGS. 3A-3F and 4A.

The bending stiffness of the membrane may be increased by increasing the moment of inertia of the membrane. For example, the moment of inertia (I) of the cross-section of the recessed portion 170 of the membrane 150 (FIG. 5A) and the moment of inertia (I) of the cross-section of the membrane 550 may be proportional to the moment of inertia of a rectangular shape section represented as formula (1)

$$I=b*h^3/12 \qquad (1)$$

wherein b is the length of the portion 500 of the membrane 150, w is the width of the recessed portion 170, D is the depth of the recessed portion 170, and h is the thickness of the cross-sections of the membranes 150 and 550 shown in FIGS. 5A and 5B.

In some embodiments, the moment of inertia (I) of the membrane 150 with the recessed portion 170 can be adjusted by varying the width w and the depth D of the recessed portion 170. Compared with the membrane 550 without the recessed portion (FIG. 5B), the membrane 150 with the recessed portion 170 (FIG. 5A) may have the increased moment of inertia (I) due to the thicker thickness h1 of sidewall portions 170-1 and 170-2 of the recessed portion 170 than thickness h of the membrane 150. Therefore, the peripheral region of the membrane 150 has increased moment of inertia and becomes stronger without increasing the thickness of the membrane 150. Stress, which may be concentrated on the peripheral region of the membrane 150 or the membrane 150 near the edge 390A of the cavity 390, is released and greatly reduced. Therefore, the membrane 150 is prevented from cracking or being broken due to stress accumulation.

The length $L_1$ of the recessed portions 170 is adjustable and may be increased to improve the rigidity of the peripheral region of the membrane 150. Also, the depth $D_2$ of the recesses 130, which shape the recessed portions 170, is adjustable and may be increased to enhance the rigidness of the peripheral region of the membrane 150.

In some embodiments, the recessed portions 170 are spaced apart from the center region of the membrane 150. The center region of the membrane 150 remains flexible. The mechanical functionality or sensitivity of the semiconductor device structure remains good. As a result, the membrane 150 has improved rigidity without adversely affecting mechanical functionality or sensitivity.

In some embodiments, the recessed portions 170 are arranged with an equal period. Each of the recessed portions 170 has a central axis (or extending axis) 410. The central axis 410 may be referred to as an extending axis or a symmetrical axis. In some embodiments, the central axis 410 substantially aligns to the center 400 of the membrane 150, as shown in FIG. 1. Accordingly, the recessed portions 170 form a regular and symmetrical radial corrugation. The membrane 150 is prevented from non-uniform deformation, such as warping or bending. As a result, the membrane 150 including the recessed portions 170 has enhanced reliability without distortion.

FIGS. 3A-3F show various top views of a semiconductor device structure, in accordance with some embodiments. The semiconductor substrate 100, the dielectric layer 110 and the membrane 150 of the semiconductor device structure are shown in FIGS. 3A-3F. Other features of the semiconductor device structure are not shown in FIGS. 3A-3F for a better understanding of the structure. It should be noted that the profiles, arrangements and dimensions shown in FIGS. 3A-3F are only examples and are not a limitation to the disclosure. In some embodiments, the materials, formation methods, and/or benefits illustrated in the aforementioned embodiments can also be applied in the embodiments illustrated in FIGS. 3A-3F, and are therefore not repeated.

Figure 3A:
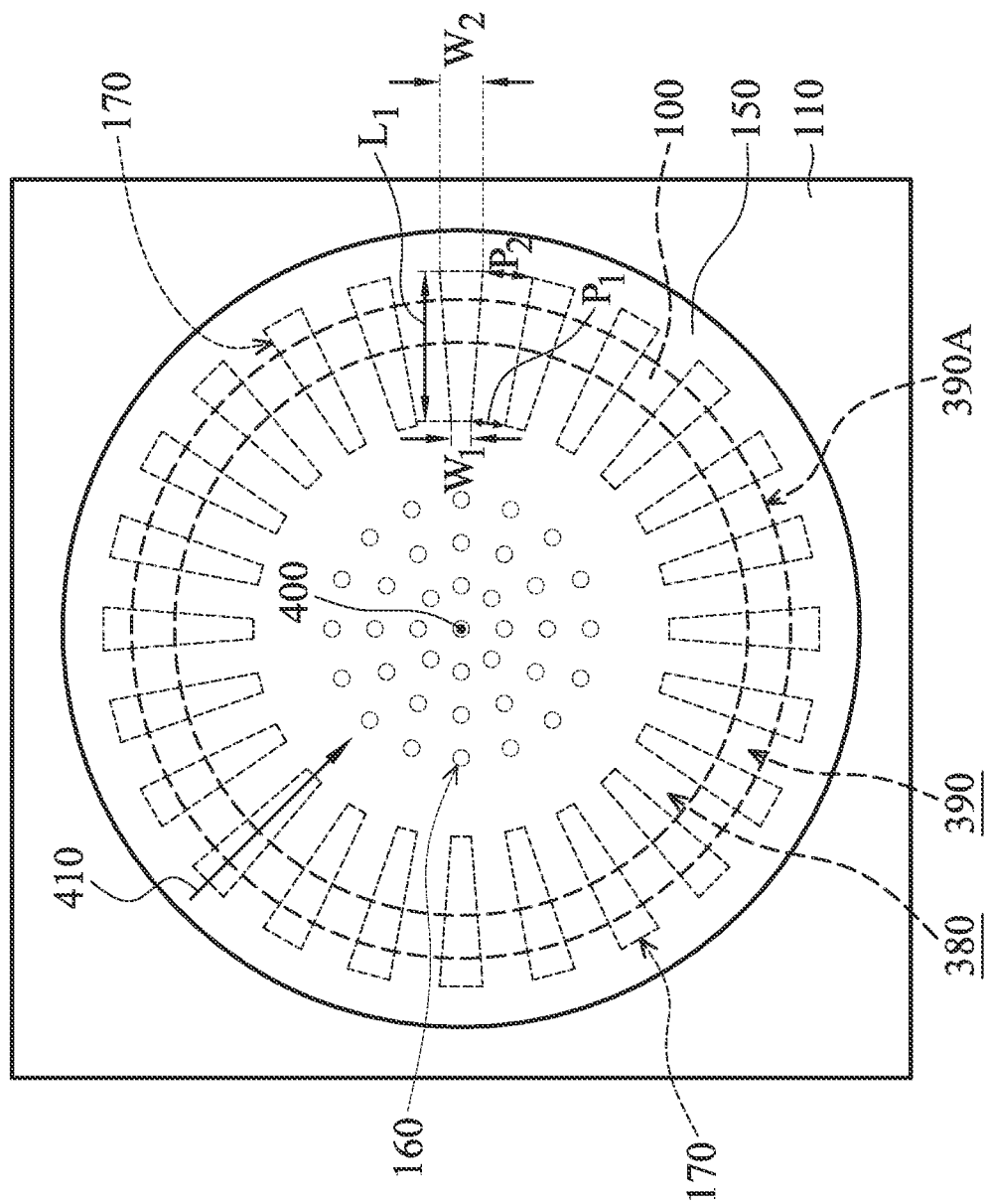
FIGS. 3A-3F show various top views of a semiconductor device structure, in accordance with some embodiments.

Many variations and/or modifications can be made to embodiments of the disclosure. For example, the shape of the recessed portions 170 of the membrane 150 may be varied. As shown in FIG. 3A, the inner width $W_1$ is less than the outer width $W_2$, in accordance with some embodiments. Accordingly, the recessed portions 170 are trapezoidal. The inner interval $P_1$ is less than the outer interval $P_2$.

Figure 3B:
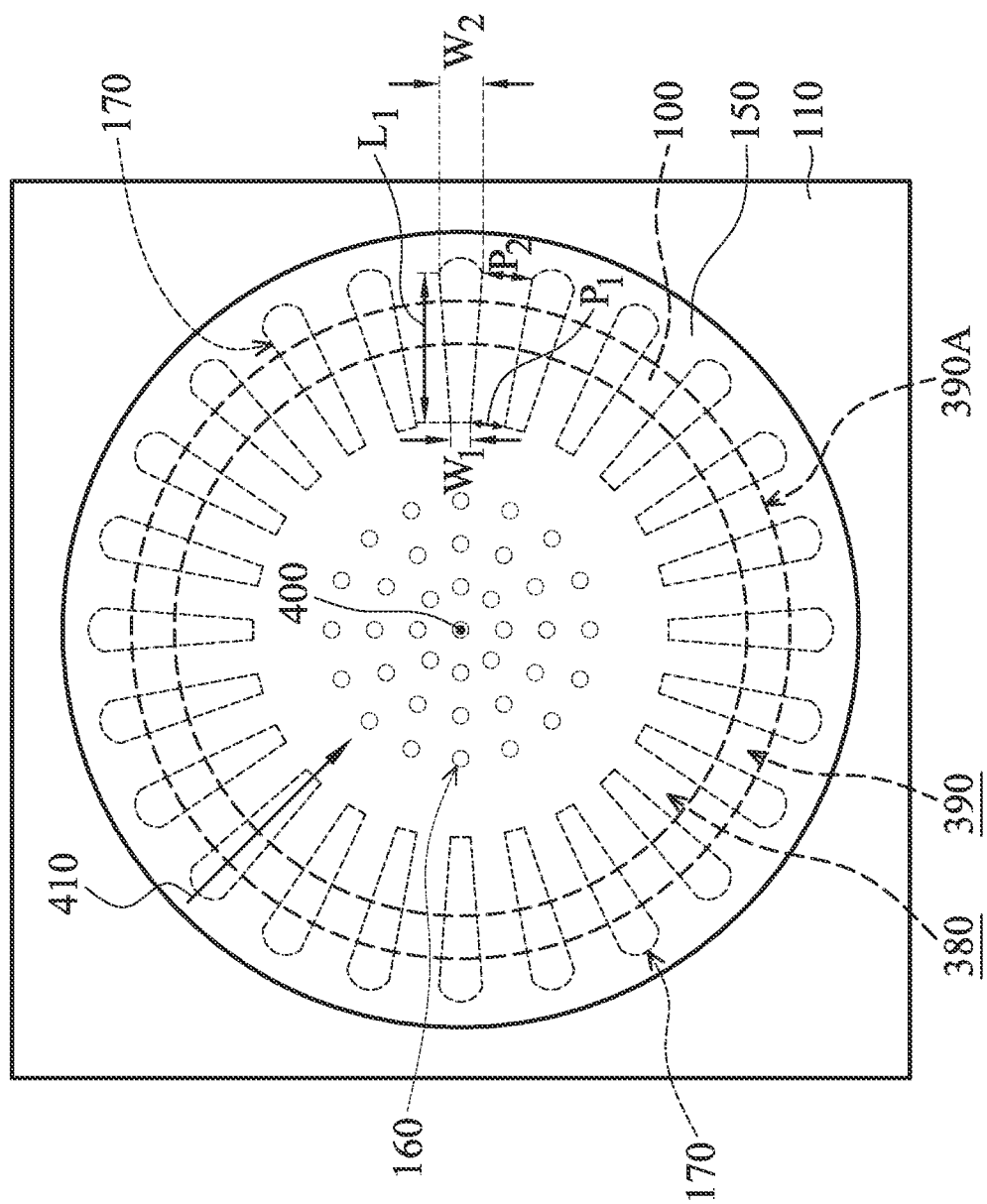
Figure 3C:
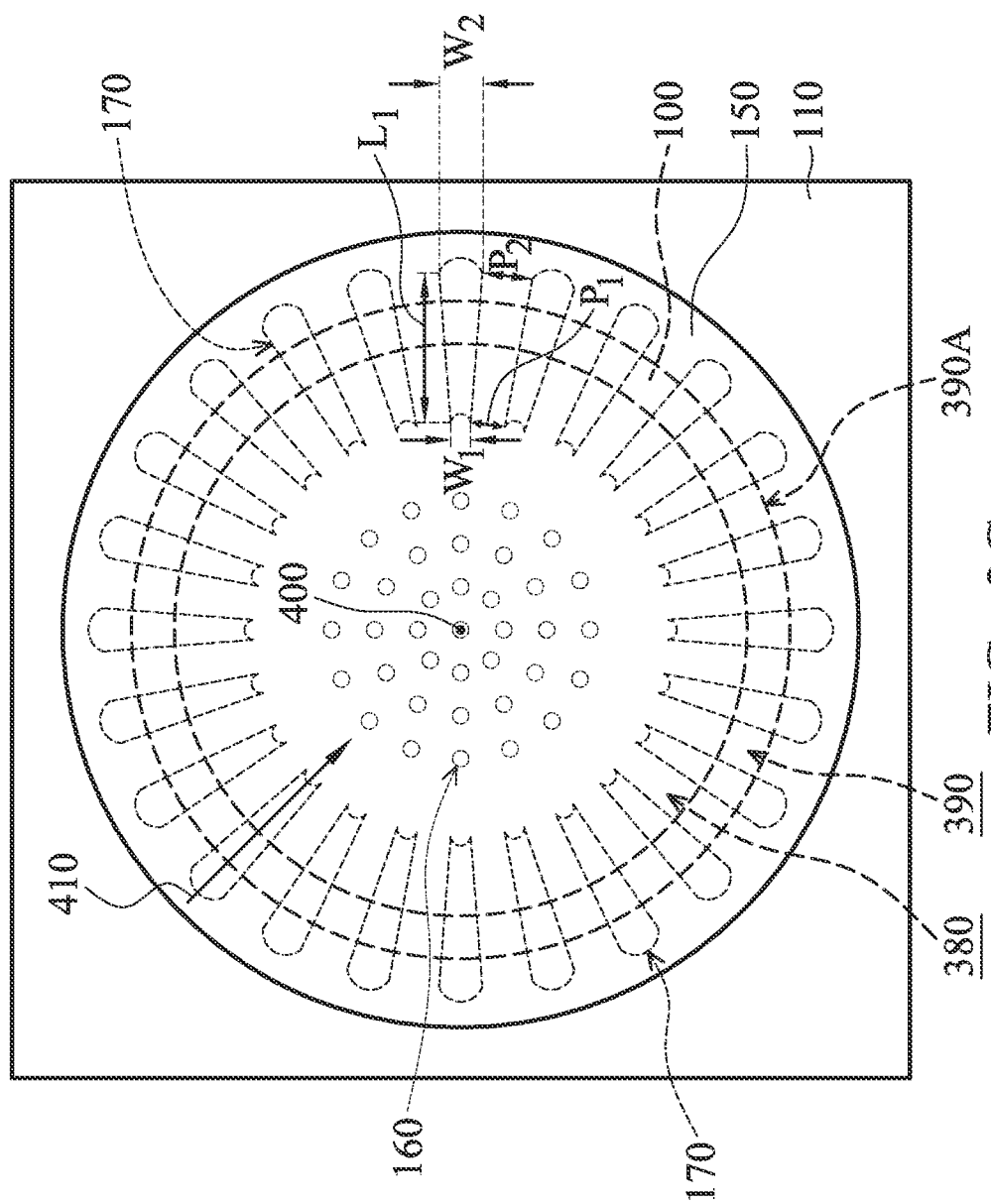

As shown in FIG. 3B, the recessed portions 170 have a flat edge with the inner width $W_1$ and a curved edge with the outer width $W_2$, in accordance with some embodiments. As shown in FIG. 3C, the recessed portions 170 have a curved edge with the inner width $W_1$ and a curved edge with the outer width $W_2$, in accordance with some embodiments.

Figure 3D:
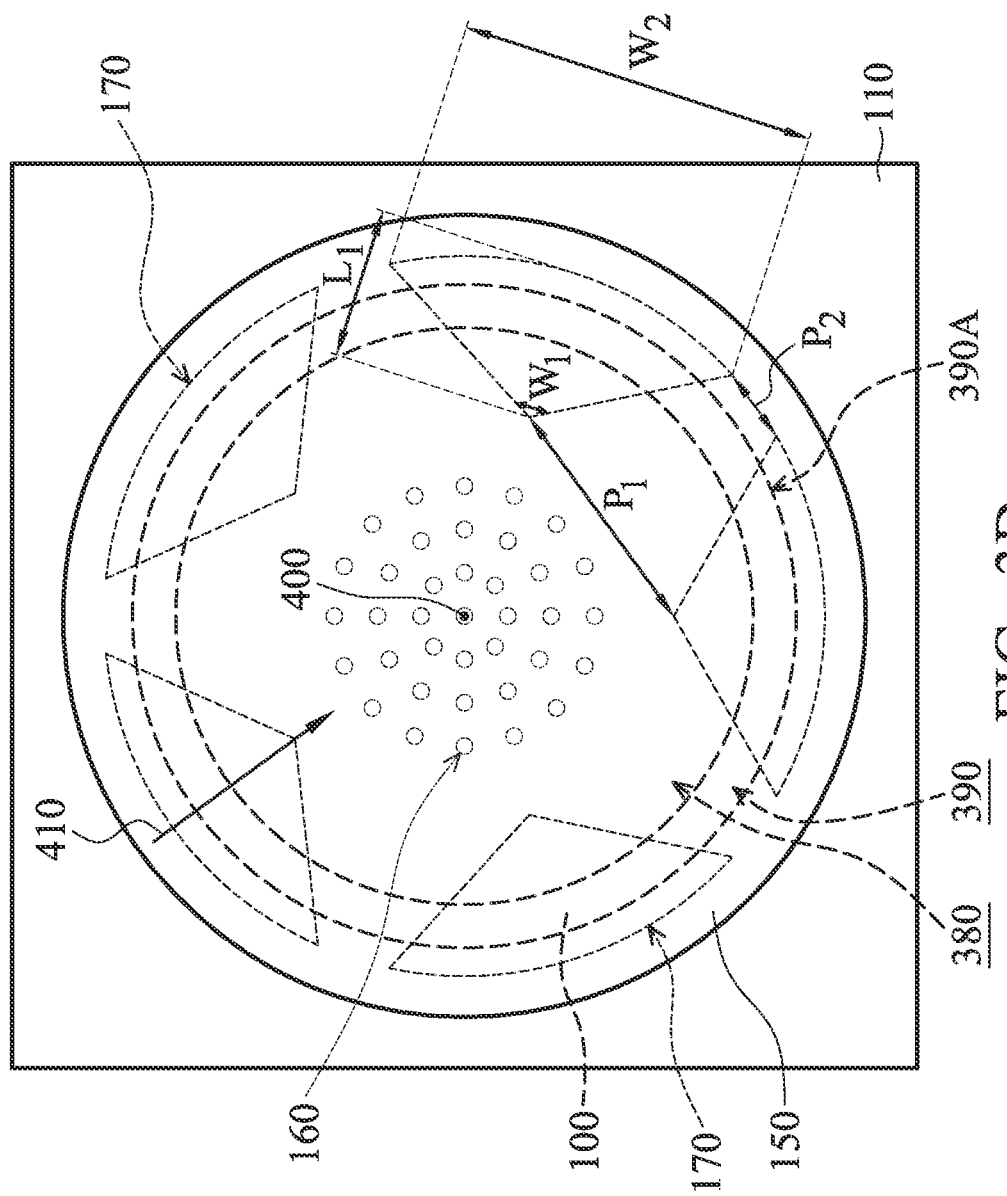
Figure 3E:
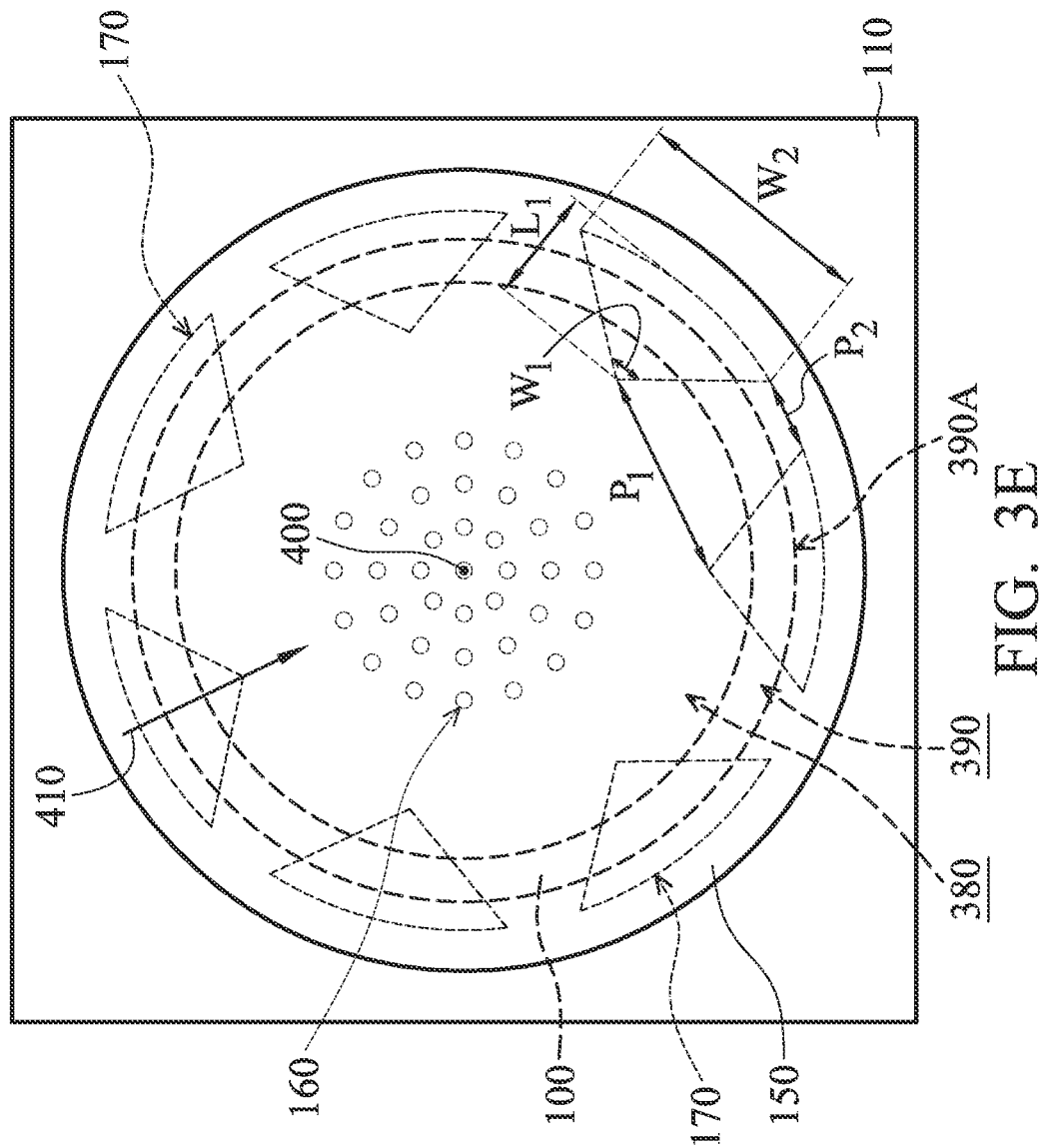

As shown in FIGS. 3D and 3E, the outer width $W_2$ is much greater than the inner width $W_1$, in accordance with some embodiments. The recessed portions 170 are substantially fan-shaped. As a result, the inner interval $P_1$ is greater than the outer interval $P_2$. The number and dimension of the fan-shaped recessed portions 170 can be varied according to requirements.

Figure 3F:
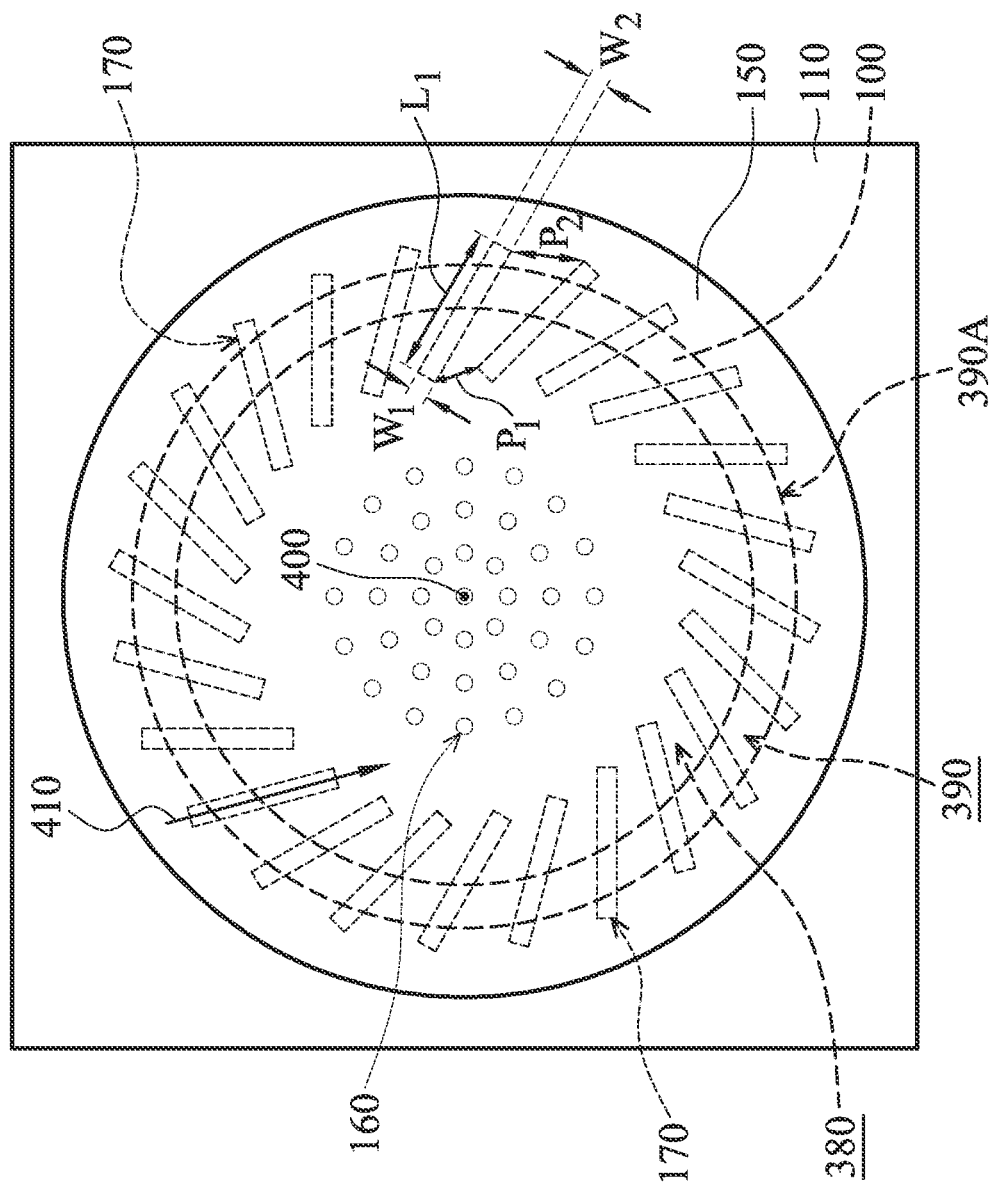

In some embodiments, the central axis 410 of the recessed portions 170 substantially aligns to the center 400 of the membrane 150, as shown in FIGS. 1 and 3A-3E. However, embodiments of the disclosure are not limited thereto. As shown in FIG. 3F, the central axis 410 of the recessed portions 170 does not align to the center 400, in accordance with some embodiments. The recessed portions 170 are arranged periodically in a circular or circle-like array. Multiple recessed portions 170 gradually shift and rotate along a clockwise or counter-clockwise direction, as shown in FIG. 3F. The arrangement of the recessed portions 170 is asymmetric.

The recessed portions 170 in FIG. 3F have the same shape as those shown in FIG. 1. However, many variations and/or modifications can be made to embodiments of the disclosure. The recessed portions 170 in FIG. 3F may have the same shape as those shown in FIGS. 3A-3C.

In accordance with some embodiments, the recessed portions 320 of the membrane 290 in FIG. 2J have similar or substantially the same profile and arrangement as the recessed portions 170 shown in FIGS. 3A-3F, and are therefore not repeated. Similarly, the recessed portions 320 prevent the membrane 290 from being broken due to stress accumulation. The edge rigidity of the membrane 290 is improved. Accordingly, the membrane 290 has enhanced reliability. For example, the semiconductor device structure including the membranes 150 and 290 with corrugations performs much better in reliability tests (such as stress tests, air blow tests, drop tests, other applicable test, or a combination thereof).

Figure 6:
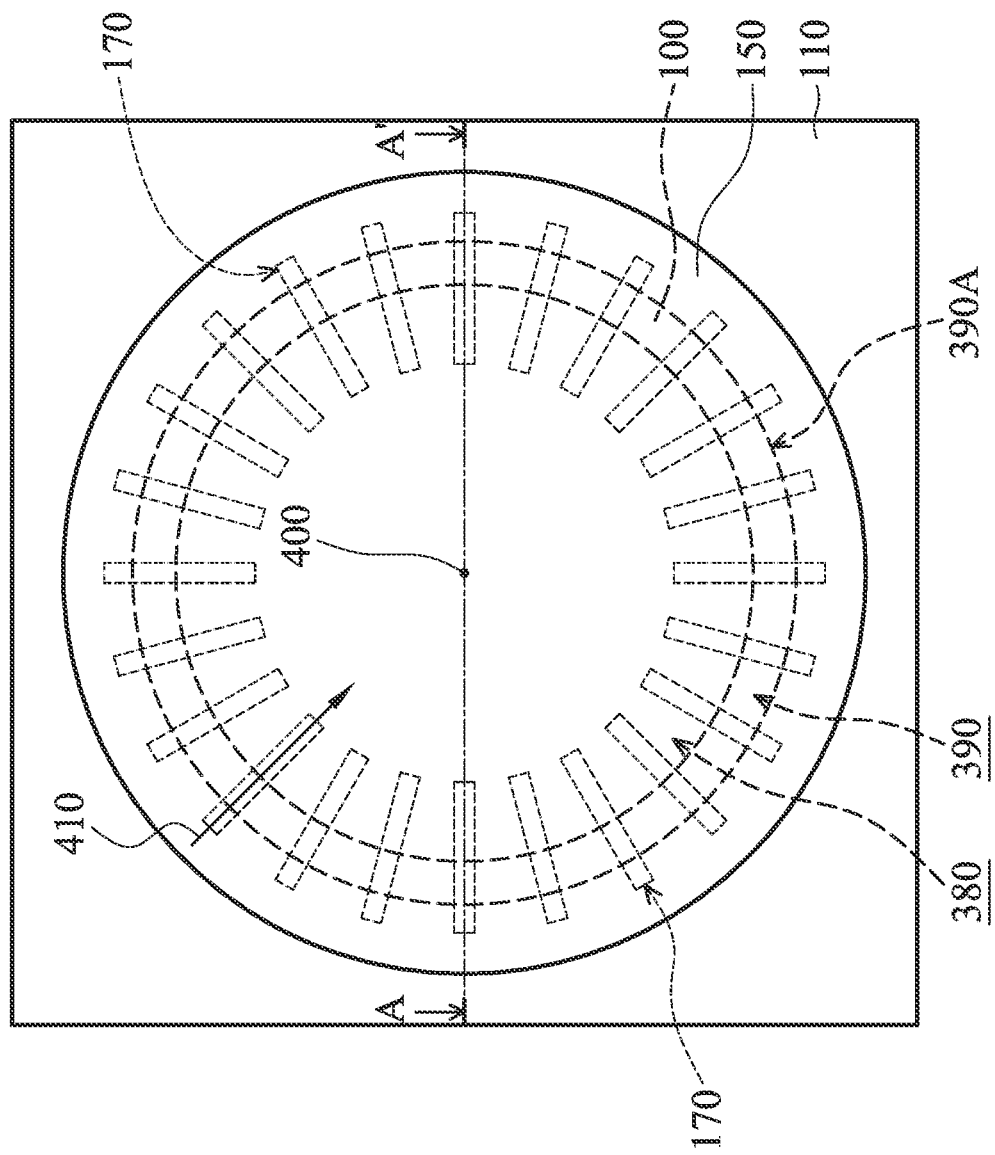
FIG. 6 is a top view of a semiconductor device structure, in accordance with some embodiments.
Figure 7A:
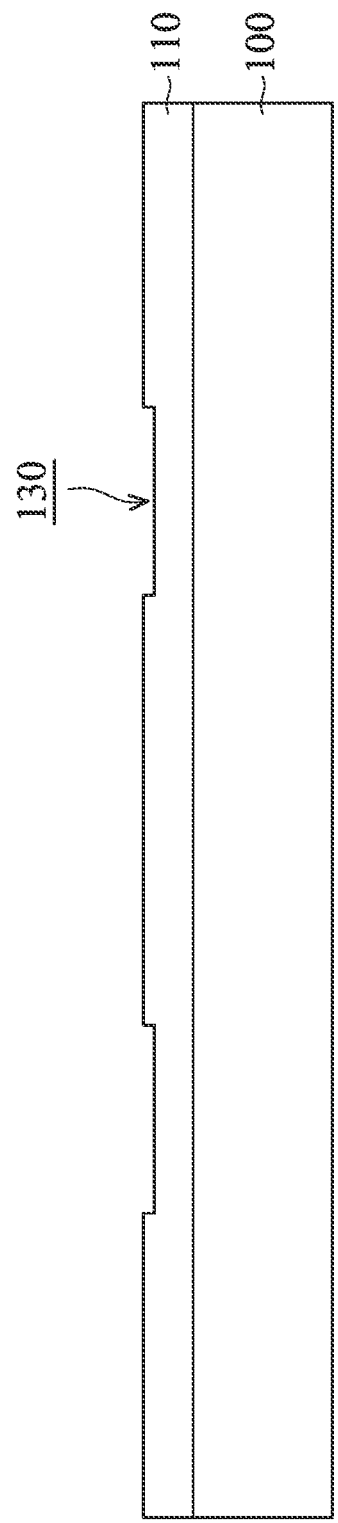
FIGS. 7A-7C are cross-sectional views along the line A-A' of FIG. 6, showing various stages of a process for forming a semiconductor device structure, in accordance with some embodiments.
Figure 7B:
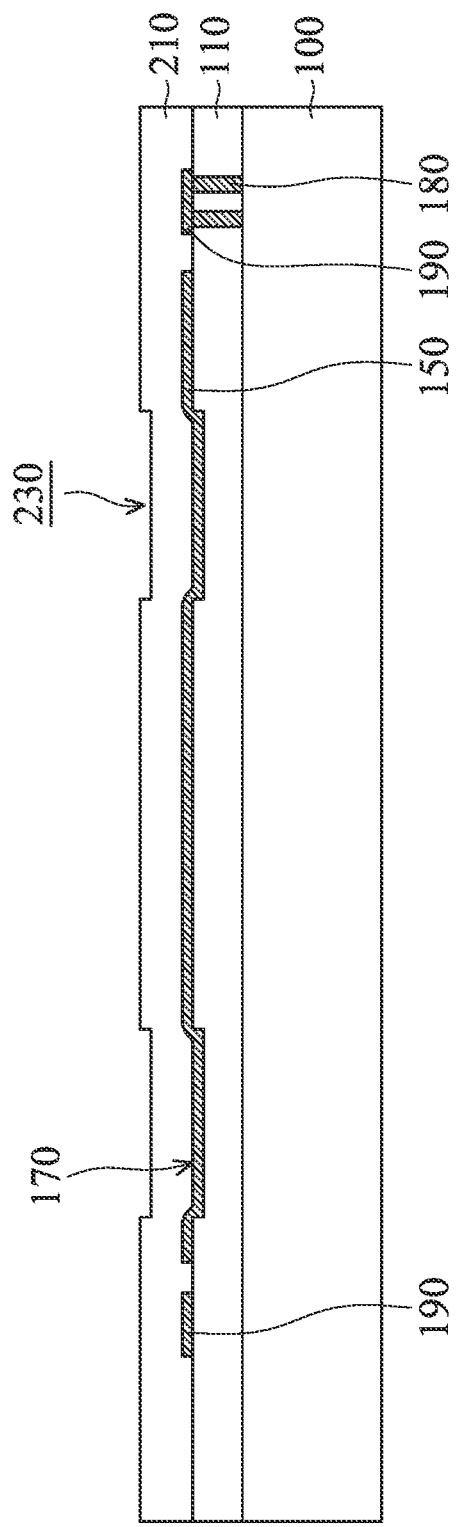
Figure 7C:
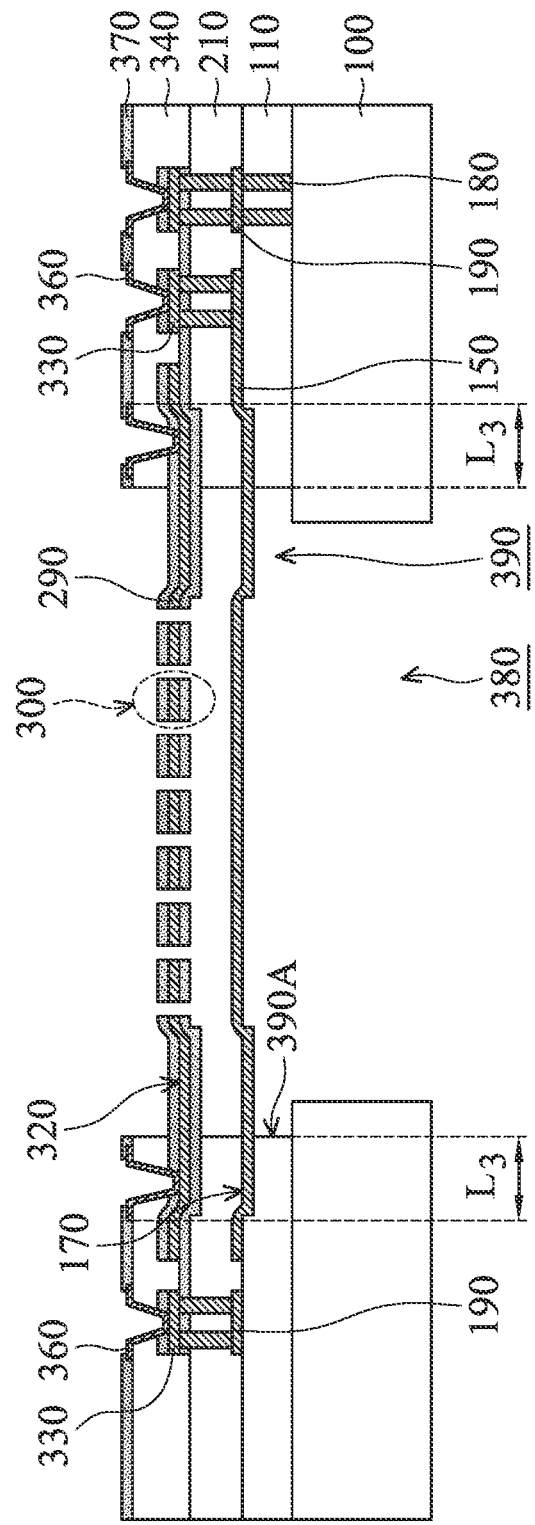

Many variations and/or modifications can be made to embodiments of the disclosure. FIG. 6 is a top view of a semiconductor device structure, in accordance with some embodiments. FIGS. 7A-7C are cross-sectional views along the line A-A' of FIG. 6, showing various stages of a process for forming a semiconductor device structure shown in FIG. 6, in accordance with some embodiments. In some embodiments, the materials, formation methods, and/or benefits illustrated in the aforementioned embodiments can also be applied in the embodiments illustrated in FIGS. 6 and 7A-7C, and are therefore not repeated.

As shown in FIG. 7A, a structure similar to that shown in FIG. 2A is provided, in accordance with some embodiments. The dielectric layer 110 is partially removed so that multiple recesses 130 are formed in the dielectric layer 110. The openings 120 shown in FIG. 2A are not formed.

Afterwards, the steps described in FIGS. 2B-2D are performed over the structure shown in FIG. 7A. The membrane 150 does not include the recessed portions 160 shown in FIG. 2D so the membrane 150 does not have dimples at its top surface, as shown in FIGS. 6 and 7B. The openings 220 shown in FIG. 2D are not formed in the dielectric layer 210.

Subsequently, the steps described in FIGS. 2E-2J are performed over the structure shown in FIG. 7B. As a result, a semiconductor device structure including MEMS elements (such as the membrane 150 and the membrane 290) is formed, as shown in FIG. 7C. The membrane 290 does not include the recessed portions 310 shown in FIG. 2H so the membrane 290 does not have dimples at its top surface, as shown in FIG. 7C.

In some embodiments, as shown in FIG. 6, the membrane 150 of the semiconductor device structure shown in FIG. 7C has a top view similar to that shown in FIG. 1 but does not include the recessed portions 160 shown in FIG. 1. However, embodiments of the disclosure are not limited. In some other embodiments, the membrane 150 shown in FIG. 7C has a top view similar to those shown in FIGS. 1B-1G but does not include the recessed portions 160 shown in FIGS. 1B-1G. The recessed portions 320 of the membrane 290 in FIG. 7C may have similar or substantially the same profile and arrangement as those shown in FIGS. 1 and 3A-3F.

Many variations and/or modifications can be made to embodiments of the disclosure. In some other embodiments, one of the membrane 150 and the membrane 290 includes recessed portions, which form dimples and sunken corrugations, while another of the membrane 150 and the membrane 290 does not include recessed portions, which form dimples and/or sunken corrugations.

Embodiments of the disclosure are not limited. For example, although figures show that the semiconductor device structure includes two membranes, the number of membranes is not limited. In some other embodiments, a semiconductor device structure includes more than two membranes. One or more of the membranes include recessed portions, which is similar to or the same as the recessed portions 170 or 320 to improve the edge rigidity of the membranes.

In some embodiments, the structure and formation methods of the recessed portions described in the disclosure are used to form membranes of MEMS devices (such as microphones or any suitable MEMS device). However, embodiments of the disclosure are not limited. In some other embodiments, the structure and formation methods of recessed portions described in the disclosure can be used to form any suitable movable membrane or diaphragm. Furthermore, embodiments of the disclosure are not limited and can be applied to fabrication processes for advanced node or any suitable technology generation.

Embodiments of the disclosure provide a semiconductor device structure. The semiconductor device structure includes a semiconductor substrate, dielectric layers over the semiconductor substrate, and a movable membrane between the dielectric layers. The movable membrane is partially exposed through a cavity in the dielectric layers. The movable membrane includes a corrugated array of multiple recessed portions in its peripheral region. The recessed portions are integrated with the movable membrane. The corrugated array increases moment of inertia and makes the peripheral region of the movable membrane much stronger without increasing the thickness of the movable membrane. Stress, which may be concentrated on the peripheral region or near the edge of the cavity, is greatly mitigated. Therefore, the movable membrane has better rigidity to prevent it from being broken.

Furthermore, the recessed portions are arranged periodically or symmetrically. It can be ensured that no distortion would be induced in the movable membrane. As a result, the movable membrane with the regular or uniform corrugation has enhanced reliability.

In some embodiments, a semiconductor device structure is provided. The semiconductor device structure includes a substrate and a first dielectric layer formed over the substrate. The semiconductor device structure also includes a first movable membrane formed over the first dielectric layer. In addition, the first movable membrane has a first corrugated portion and a first edge portion connecting to the first corrugated portion. The semiconductor device structure further includes a second dielectric layer formed over the first movable membrane. In addition, the first edge portion is sandwiched between the first dielectric layer and the second dielectric layer, the first corrugated portion is partially sandwiched between the first dielectric layer and the second dielectric layer and is partially exposed by a cavity, and a bottom surface of the first corrugated portion is lower than a bottom surface of the first edge portion.

In some embodiments, a semiconductor device structure is provided. The semiconductor device structure includes a substrate and a first dielectric layer formed over the substrate. The semiconductor device structure also includes a movable membrane formed over the first dielectric layer. In addition, the movable membrane has corrugated portions and recessed portions. The semiconductor device structure further includes a second dielectric layer formed over the movable membrane. In addition, the recessed portions are spaced apart from the first dielectric layer and the second dielectric layer, and the corrugated portions are partially sandwiched between the first dielectric layer and the second dielectric layer.

In some embodiments, a method for forming a semiconductor device structure is provided. The method includes forming a first dielectric layer over a substrate and forming a first recess in the first dielectric layer. The method also includes forming a first movable membrane over the first dielectric layer. In addition, the first movable membrane has a first corrugated portion formed in the first recess. The method further includes forming a second dielectric layer over the first movable membrane and partially removing the substrate to form a first cavity and partially removing the first dielectric layer and the second dielectric layer to form a second cavity. In addition, a portion of the first corrugated portion is exposed by the second cavity while vertically overlaps the substrate.

In some embodiments, a method for forming a semiconductor device structure is provided. The method includes forming a first dielectric layer over a substrate and forming a first recess in the first dielectric layer. The method also includes conformally forming a first movable membrane over the first dielectric layer. In addition, the first movable membrane has a first corrugated portion in the first recess. The method further includes forming a second dielectric layer over the first movable membrane and partially removing the substrate, the first dielectric layer, and the second dielectric layer to form a cavity. In addition, the first corrugated portion of the first movable membrane is partially sandwiched between the first dielectric layer and the second dielectric layer.

In some embodiments, a method for forming a semiconductor device structure is provided. The method includes forming a first dielectric layer over a substrate and forming a first recess and a second recess in the first dielectric layer. The method also includes forming a first movable membrane over the first dielectric layer. In addition, the first membrane has a first corrugated portion formed over the first recess and a first recessed portion formed over the second recess. The method also includes forming a second dielectric layer over the first movable membrane and forming a cavity through the substrate, the first dielectric layer, and the second dielectric layer to expose first recessed portion and to partially expose the first corrugated portion of the first movable membrane.

In some embodiments, a method for forming a semiconductor device structure is provided. The method includes forming a first dielectric layer over a semiconductor substrate and partially removing the first dielectric layer to form first recesses. The method also includes forming a first membrane over the first dielectric layer. In addition, the first membrane fills the first recesses so that the first membrane includes first corrugated portions. The method further includes forming a second dielectric layer over the first dielectric layer to cover the first corrugated portions and partially removing the semiconductor substrate, the first dielectric layer, and the second dielectric layer to form a cavity partially exposing the first corrugated portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a substrate;
a first dielectric layer formed over the substrate;
a first movable membrane formed over the first dielectric layer, wherein the first movable membrane has a first corrugated portion and a first edge portion connecting to the first corrugated portion; and
a second dielectric layer formed over the first movable membrane,
wherein the first edge portion is sandwiched between the first dielectric layer and the second dielectric layer, the first corrugated portion is partially sandwiched between the first dielectric layer and the second dielectric layer and is partially exposed by a cavity, and a bottom surface of the first corrugated portion is lower than a bottom surface of the first edge portion.

2. The semiconductor device structure as claimed in claim 1, wherein a sidewall of the first dielectric layer and a sidewall of the second dielectric layer are exposed by the cavity.

3. The semiconductor device structure as claimed in claim 2, wherein a sidewall of the substrate is exposed by the cavity, and a top surface of the substrate is partially covered by the first dielectric layer and is partially exposed by the cavity.

4. The semiconductor device structure as claimed in claim 1, wherein the first movable membrane further comprises recessed portions, and the recessed portion is exposed by the cavity and is spaced apart from the first dielectric layer and the second dielectric layer.

5. The semiconductor device structure as claimed in claim 1, further comprising:
a second movable membrane formed over the second dielectric layer, wherein the second movable membrane comprises:
a first isolation layer formed over the second dielectric layer;
a membrane material formed over the first isolation layer; and
a second isolation layer formed over the membrane material.

6. The semiconductor device structure as claimed in claim 5, wherein the second movable membrane has a second corrugated portion and a second edge portion connecting to the second corrugated portion, and the first corrugated portion overlaps the second corrugated portion.

7. The semiconductor device structure as claimed in claim 6, further comprising:
a conductive via connecting the first edge portion of the first movable membrane and the second edge portion of the second movable membrane.

8. The semiconductor device structure as claimed in claim 7, wherein the conductive via penetrates the second dielectric layer and the first isolation layer of the second movable membrane.

9. A semiconductor device structure, comprising:
a substrate;
a first dielectric layer formed over the substrate;
a movable membrane formed over the first dielectric layer, wherein the movable membrane has corrugated portions and recessed portions; and
a second dielectric layer formed over the movable membrane,
wherein the recessed portions are spaced apart from the first dielectric layer and the second dielectric layer, and the corrugated portions are partially sandwiched between the first dielectric layer and the second dielectric layer.

10. The semiconductor device structure as claimed in claim 9, wherein the corrugated portions are positioned at a peripheral region of the movable membrane and surround the recessed portions in a top view.

11. The semiconductor device structure as claimed in claim 9, wherein a sidewall of the first dielectric layer, a sidewall of the second dielectric layer, and a portion of a top surface of the substrate are exposed by a cavity, and the recessed portions are completely positioned in the cavity.

12. The semiconductor device structure as claimed in claim 11, wherein each of the corrugated portions has a flat edge exposed by the cavity and a curved edge embedded in the first dielectric layer and the second dielectric layer.

13. A semiconductor device structure, comprising:
a first dielectric layer and a second dielectric layer stacked over a substrate, wherein a first cavity penetrates through the first dielectric layer and the second dielectric layer in a first direction; and
a first movable membrane sandwiched between the first dielectric layer and the second dielectric layer, wherein the first movable membrane comprises:
a first corrugated portion extending along opposite sides of a first edge portion of the first cavity in a second direction different from the first direction; and
a second corrugated portion extending along opposite sides of a second edge portion of the first cavity.

14. The semiconductor device structure as claimed in claim 13, wherein the first movable membrane further comprises:
recessed portions laterally sandwiched between the first corrugated portion and the second corrugated portion.

15. The semiconductor device structure as claimed in claim 14, wherein the recessed portions are spaced apart from the first dielectric layer and the second dielectric layer in the second direction.

16. The semiconductor device structure as claimed in claim 13, wherein the first corrugated portion is aligned with the second corrugated portion in the second direction.

17. The semiconductor device structure as claimed in claim 13, wherein the first movable membrane further comprises:
a third corrugated portion extending along opposite sides of a third edge portion of the first cavity; and
a fourth corrugated portion extending along opposite sides of a fourth edge portion of the first cavity.

18. The semiconductor device structure as claimed in claim 17, wherein the first corrugated portion, the second corrugated portion, the third corrugated portion, and the fourth corrugated portion are spaced apart from each other.

19. The semiconductor device structure as claimed in claim 13, wherein the first cavity has a round shape in a top view.

20. The semiconductor device structure as claimed in claim 13, wherein the substrate has a second cavity, and the first cavity is wider than the second cavity in the second direction in a top view.

* * * * *